United States Patent
Lue et al.

(10) Patent No.: US 7,414,889 B2
(45) Date of Patent: Aug. 19, 2008

(54) STRUCTURE AND METHOD OF SUB-GATE AND ARCHITECTURES EMPLOYING BANDGAP ENGINEERED SONOS DEVICES

(75) Inventors: Hang-Ting Lue, Hsinchu (TW); Hao Ming Lien, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 128 days.

(21) Appl. No.: 11/419,977

(22) Filed: May 23, 2006

(65) Prior Publication Data

US 2007/0284620 A1   Dec. 13, 2007

(51) Int. Cl.
G11C 11/34 (2006.01)
G11C 16/06 (2006.01)
(52) U.S. Cl. ............... 365/185.18; 365/185.28; 365/185.29
(58) Field of Classification Search ............ 365/185.28, 365/185.29, 185.18
See application file for complete search history.

(56) References Cited

U.S. PATENT DOCUMENTS

| | | | |
|---|---|---|---|
| 4,630,086 A | 12/1986 | Sato et al. | |
| 5,286,994 A | 2/1994 | Ozawa et al. | |
| 5,319,229 A | 6/1994 | Shimoji et al. | |
| 5,952,692 A | 9/1999 | Nakazato et al. | |
| 6,011,725 A | 1/2000 | Eitan et al. | |
| 6,026,026 A | 2/2000 | Chan et al. | |
| 6,074,917 A | 6/2000 | Chang et al. | |
| 6,169,693 B1 | 1/2001 | Chan et al. | |
| 6,218,700 B1 | 4/2001 | Papadas et al. | |
| 6,512,696 B1 | 1/2003 | Fan et al. | |
| 6,709,928 B1 | 3/2004 | Jenne et al. | |
| 6,720,630 B2 | 4/2004 | Mandelman et al. | |
| 6,784,480 B2 | 8/2004 | Bhattacharyya | |
| 6,818,558 B1 | 11/2004 | Rathor et al. | |
| 6,897,533 B1 | 5/2005 | Yang et al. | |
| 6,912,163 B2 | 6/2005 | Zheng et al. | |
| 6,977,201 B2 | 12/2005 | Jung et al. | |
| 7,075,828 B2 | 7/2006 | Lue et al. | |

(Continued)

FOREIGN PATENT DOCUMENTS

EP   0016246   10/1980

(Continued)

OTHER PUBLICATIONS

Office Action mailed Nov. 23, 2007 in U.S. Appl. No. 11/197,668.

(Continued)

Primary Examiner—Richard T. Elms
Assistant Examiner—Toan Le
(74) Attorney, Agent, or Firm—Kenta Suzue; Haynes Beffel & Wolfeld LLP

(57) ABSTRACT

A bandgap engineered SONOS device structure for design with various AND architectures to perform a source side injection programming method. The BE-SONOS device structure comprises a spacer oxide disposed between a control gate overlaying an oxide-nitride-oxide-nitride-oxide stack and a sub-gate overlaying a gate oxide. In a first embodiment, a BE-SONOS sub-gate-AND array architecture is constructed multiple columns of SONONOS devices with sub-gate lines and diffusion bitlines. In a second embodiment, a BE-SONOS sub-gate-inversion-bitline-AND architecture is constructed multiple columns of SONONOS devices with sub-gate inversion bitlines and with no diffusion bitlines.

5 Claims, 24 Drawing Sheets

U.S. PATENT DOCUMENTS

| | | | |
|---|---|---|---|
| 7,115,469 | B1 | 10/2006 | Halliyal et al. |
| 7,115,942 | B2 | 10/2006 | Wang |
| 7,133,313 | B2 | 11/2006 | Shih et al. |
| 7,151,692 | B2 | 12/2006 | Wu et al. |
| 7,158,420 | B2 * | 1/2007 | Lung .................. 365/185.3 |
| 7,164,603 | B2 | 1/2007 | Shih et al. |
| 7,187,590 | B2 | 3/2007 | Zous et al. |
| 7,190,614 | B2 | 3/2007 | Wu et al. |
| 7,209,390 | B2 | 4/2007 | Lue et al. |
| 2003/0030100 | A1 | 2/2003 | Lee et al. |
| 2003/0032242 | A1 | 2/2003 | Lee et al. |
| 2003/0042534 | A1 | 3/2003 | Bhattacharyya |
| 2003/0047755 | A1 | 3/2003 | Lee et al. |
| 2003/0146465 | A1 | 8/2003 | Wu |
| 2003/0224564 | A1 | 12/2003 | Kang et al. |
| 2004/0079983 | A1 | 4/2004 | Chae et al. |
| 2004/0183126 | A1 | 9/2004 | Bae et al. |
| 2004/0256679 | A1 | 12/2004 | Hu |
| 2005/0006696 | A1 | 1/2005 | Noguchi et al. |
| 2005/0023603 | A1 | 2/2005 | Eldridge et al. |
| 2005/0074937 | A1 | 4/2005 | Jung |
| 2005/0093054 | A1 | 5/2005 | Jung |
| 2005/0219906 | A1 | 10/2005 | Wu |
| 2005/0237801 | A1 | 10/2005 | Shih |
| 2005/0237809 | A1 | 10/2005 | Shih et al. |
| 2005/0237813 | A1 | 10/2005 | Zous et al. |
| 2005/0237815 | A1 | 10/2005 | Lue et al. |
| 2005/0237816 | A1 | 10/2005 | Lue et al. |
| 2005/0270849 | A1 | 12/2005 | Lue |
| 2005/0281085 | A1 | 12/2005 | Wu |
| 2006/0198189 | A1 | 9/2006 | Lue et al. |
| 2006/0198190 | A1 | 9/2006 | Lue |
| 2006/0202252 | A1 | 9/2006 | Wang et al. |
| 2006/0202261 | A1 | 9/2006 | Lue et al. |
| 2006/0258090 | A1 | 11/2006 | Bhattacharyya et al. |
| 2006/0261401 | A1 | 11/2006 | Bhattacharyya |
| 2006/0281260 | A1 | 12/2006 | Lue |
| 2007/0001210 | A1 * | 1/2007 | Hsu et al. .................. 257/314 |
| 2007/0012988 | A1 | 1/2007 | Bhattacharyya |
| 2007/0029625 | A1 | 2/2007 | Lue et al. |
| 2007/0031999 | A1 | 2/2007 | Ho et al. |
| 2007/0045718 | A1 | 3/2007 | Bhattacharyya |
| 2007/0069283 | A1 | 3/2007 | Shih et al. |

FOREIGN PATENT DOCUMENTS

| | | |
|---|---|---|
| EP | 1411555 | 4/2004 |
| JP | 11040682 | 2/1999 |
| JP | 2004363329 | 12/2004 |

OTHER PUBLICATIONS

Office Action mailed Oct. 19, 2007 in U.S. Appl. No. 11/324,495.

White et al., "On the Go with SONOS" IEEE Circuits and Devices, Jul. 2000, 22-31.

Walker, et al., "3D TFT-SONOS Memory Cell for Ultra-High Density File Storage Applications," 2003 Symposium on VLSI Tech Digest of Technical Papers, 29-30.

Minami et al., "New Scaling Guidelines for MNOS Nonvolatile Memory Devices," IEEE Trans on Electron Devices 38(11) Nov. 1991 2519-2526.

Ito et al., "A Novel MNOS Technology Using Gate Hole Injection in Erase Operation for Embedded Nonvolatile Memory Applications," 2004 Symp. on VLSI Tech Digest of Tech Papers 2004, 80-81.

Eitan et al., "NROM: A Novel Localized Trapping, 2-Bit Nonvolatile Memory Cell," IEEE Electron Device Lett 21(11) Nov. 2000, 543-545.

Chindalore et al., "A New Combination-Erase Technique for Erasing Nitride Based (SONOS) Nonvolatile Memories," IEEE Electron Dev Lett 24(4) Apr. 2003, 257-259.

DiMaria, D.J., et al., "Conduction Studies in Silicon Nitride: Dark Currents and Photocurrents," IBM J. Res. Dev. May 1977, 227-244.

Yeh, C.C., et al., "Phines: A Novel Low Power Program/Erase, Small Pitch, 2-Bit per Cell Flash Memory," IEDM Tech Digest 2002, 931-934.

Hijaya, S., et al., "High-Speed Write/Erase EAROM Cell with Graded Energy BAnd-Gap Insulator," Electronics and Comm in Japan, Part 2, vol. 68, No. 2, Jun. 6, 1984, 28-36.

Hinkle, C.L., et al., "Enhanced tunneling in stacked gate dielectrics with ultra-thin $HfO_2$ ($ZrO_2$) layers sandwiched between thicker $SiO_2$ Layers," Surface Science Sep. 20, 2004, vol. 566-568, 1185-1189.

Buckley, J., et al., "Engineering of 'Conduction band—Crested Barriers' or 'Dielectric Constant—Crested Barriers' in view of their application of floating-gate non-volatile memory devices," VLSI 2004, 55-56.

Takata, M., et al., "New Non-Volatile Memory with Extremely High Density Metal Nano-Dots," IEEE IEDM 03-553, 22.5.1-22.5.4.

Lee, Chungho, et al., "Operational and Reliability Comparison of Discrete-Storage Nonvolatile Memories: Advantages of Single-and Double-Layer Metal Nanocrystals," IEEE IEDM 03-557, 22.6.1-22.6.4.

Baik, Seung, et al., "High Speed and Nonvolatile Si Nanocrystal Memory for Scaled Flash Technology using Highly Field-Sensitive Tunnel Barrier," IEEE IEDM 03-545, 22.3.1-22.3.4.

Lee, Chang, et al., "A Novel SONOS Structure of $SiO_2/SiN/Al_2O_3$ with TaN Metal Gate for Multi-Giga Bit Flash Memeries," IEEE 2003, 4 pages.

Cho et al., "Simultaneous Hot-Hole Injection at Drain and Source for Efficient Erase and Excellent Endurance in SONOS Flash EEPROM Cells," IEEE Electron Device Lett., vol. 24, No. 4, Apr. 2003, 260-262.

Shih et al., "A Novel 2-bit/cell Nitride Storage Flash memory with Greater than 1M P/E-cycle Endurance," IEEE IEDM 2004, pp. 36.3.1-36.3.4.

Blomme, et al., "Multilayer tunneling barriers for nonvolatile memory applications," 60th Device Research Conf., 2002, Conf. Digest 153-154.

Blomme, et al., Write/Erase Cycling Endurance of Memory Cells with $SiO_2/HfO_2$ Tunnel Dielectric, IEEE Trans on Device and Materials Reliability, vol. 4, No. 3, Sep. 2004, 345-351.

Govoreanu, et al, "Variot: A Novel Multilayer Tunnel Barrier Concept for Low-Voltage Nonvolatile Memory Devices," IEEE Electron Device Lett., vol. 24, No. 2, Feb. 2003, 99-101.

Govoreanu et al., "Simulation of Nanofloating Gate Memory with High-k Stacked Dielectrics," IEEE SISPAD Int'l Conf. 305 Sep. 2003, 299-302.

Govoreanu et al., "An Investigation of the Electron Tunneling Leakage Current through Ultrathin Oxides/High-k Gate Stacks at Inversion Conditions," IEEE SISPAD Int'l Conf. Sep. 3-5, 2003, 287-290.

Kim et al., "Robust Multi-bit Programmable Flash Memory Using a Resonant Tunnel Barrier," Electron Dev. Mtg. Dec. 5-7, 2005, IEDM Tech Dig. 861-864.

Likharev, "Layered tunnel barriers for nonvolatile memory devices," Applied Physics Lett, vol. 73, No. 15, Oct. 1998, 2137-2139.

Sung, et al., "Multi-layer SONOS with Direct Tunnel Oxide for High Speed and Long Retention Time," IEEE 2002 Nanoelectronics Workshop, Jun. 2002, 83-84.

Aminzadeh et al., "Conduction and Charge Trapping in Polysilicon-Silicon Nitride-Oxide-Silicon Structures under Positive Gate Bias," IEEE Transactions on Electron Devices, vol. 35, No. 4, Apr. 1998, 459-467.

Yamada, et al., "A self-convergence erasing scheme for a simple stacked gate flash EEPROM," Proc. of the Int'l Electron Dev. Mtg., IEEE Dec. 1991, 307-310.

Lue et al., "A Novel P-Channel NAND-Type Flash memory with 2-bit/cell Operation and High Programming Throughput (>20 MB/sec)," IEEE 2005, 4 pages.

Tsai et al., "Novel SONOS-Type Nonvolatile Memory Device with Suitable Band Offset in HfAlO Charge-Trapping Layer," Int'l Symp. on VLSI Tech, Systems and Applications, Apr. 23-25, 2007, 2 pages.

Lue et al., "A BE-SONOS (Bandgap Engineered SONOS) NAND for Post-Floating Gate Era Flash Memory," Int'l Symp on VLSI Tech, Apr. 23-25, 2007, 2 pages.

Wen, Huang-Chun, et al., "Issues associated with p-type band-edge effective work function metal electrodes: Fermi-level pinning and flatband roll-off," In'l Symp on VLSI Technology, Systems and Applications, Apr. 23-25, 2007, 2 pages.

Padilla, Alvaro, et al., "Dual-bit SONOS FinFET Non-Volatile Memory Cell and New Method of Charge Detection," Int'l Symp on VLSI Technology, Systems and Applications, Apr. 23-25, 2007, 2 pages.

Y. Sasago et al. "90-nm-node Multi-Level AG-AND Type Flash Memory with Cell Size of True 2 $F^2$/bit and Programming Throughput of 10 MB/s" IEEE 2003, consisting of 4 pages.

Y. Sasago et al. "10-MB/s Multi-Level Programming of Gb-Scale Flash Memory Enabled by New AG-AND Cell Technology" IEEE 2002, pp. 952-954.

H. Lue et al. "BE-SONOS: A Bandgap Engineered SONOS with Excellent Performance and Reliablity" Electron Devices Meeting, 2005, IEDM Technical Digest, IEEE International, Dec. 5-7, 2005, pp. 547-550.

M. Kato et al. "A 0.4-um2 Self-Aligned Contactless Memory Cell Technology Suitable for 256-Mbit Flash Memories" Electron Devices Meeting, 1994, Technical Digest, International, Dec. 1994, pp. 921-923.

* cited by examiner

STRUCTURE AND METHOD OF SUB-GATE AND ARCHITECTURES EMPLOYING BANDGAP ENGINEERED SONOS DEVICES

BACKGROUND OF THE INVENTION

1. Field of the Invention

The present invention relates generally to non-volatile memory devices, and more particularly, to nitride-based trapping-storage flash memories.

2. Description of Related Art

Electrically programmable and erasable non-volatile memory technologies based on charge storage structures known as Electrically Erasable Programmable Read-Only Memory (EEPROM) and flash memory are used in a variety of modem applications. A flash memory is designed with an array of memory cells that can be independently programmed and read. Sense amplifiers in a flash memory are used to determine the data value or values stored in a non-volatile memory. In a typical sensing scheme, an electrical current through the memory cell being sensed is compared to a reference current by a current sense amplifier.

A number of memory cell structures are used for EEPROM and flash memory. As the dimensions of integrated circuits shrink, greater interest is arising for memory cell structures based on charge trapping dielectric layers, because of the scalability and simplicity of the manufacturing processes. Memory cell structures based on charge trapping dielectric layers include structures known by the industry names Nitride Read-Only Memory, Poly-Silicon-Oxide-Nitride-Oxide-Silicon (SONOS), and PHINES, for example. These memory cell structures store data by trapping charge in a charge trapping dielectric layer, such as silicon nitride. As negative charge is trapped, the threshold voltage of the memory cell increases. The threshold voltage of the memory cell is reduced by removing negative charge from the charge trapping layer.

Nitride Read-Only Memory devices use a relatively thick bottom oxide, e.g. greater than 3 nanometers, and typically about 5 to 9 nanometers, to prevent charge loss. Instead of direct tunneling, band-to-band tunneling induced hot hole injection BTBTHH can be used to erase the cell. However, the hot hole injection causes oxide damage, leading to charge loss in the high threshold cell and charge gain in the low threshold cell. Moreover, the erase time must be increased gradually during program and erase cycling due to the hard-to-erase accumulation of charge in the charge trapping structure. This accumulation of charge occurs because the hole injection point and electron injection point do not coincide with each other, and some electrons remain after the erase pulse. In addition, during the sector erase of an Nitride Read-Only Memory flash memory device, the erase speed for each cell is different because of process variations (such as channel length variation). This difference in erase speed results in a large Vt distribution of the erase state, where some of the cells become hard to erase and some of them are over-erased. Thus the target threshold Vt window is closed after many program and erase cycles and poor endurance is observed. This phenomenon will become more serious when the technology keeps scaling down.

A typical flash memory cell structure positions a tunnel oxide layer between a conducting polysilicon tunnel oxide layer and a crystalline silicon semiconductor substrate. The substrate refers to a source region and a drain region separated by an underlying channel region. A flash memory read can be executed by a drain sensing or a source sensing. For source side sensing, one or more source lines are coupled to source regions of memory cells for reading current from a particular memory cell in a memory array.

A traditional floating gate device stores 1 bit of charge in a conductive floating gate. The advent of Nitride Read-Only Memory cells in which each cell provides 2 bits of flash cells that store charge in an Oxide-Nitride-Oxide (ONO) dielectric. In a typical structure of a Nitride Read-Only Memory memory cell, a nitride layer is used as a trapping material positioned between a top oxide layer and a bottom oxide layer. The ONO layer structure effectively replaces the gate dielectric in floating gate devices. The charge in the ONO dielectric with a nitride layer may be either trapped on the left side or the right side of a NROM cell.

Floating gate devices encounter substantial scaling challenges due to inter-floating gate coupling, while nitride trapping device is flexible from such limitations. There are two main types of nitride trapping device: NROM that stores charges locally and SONOS that uses channel program/erase. These two types of devices have drawbacks. A Nitride Read-Only Memory device is sensitive to hot-hole induced damages, and a SONOS device suffers from retention problems caused by direct tunneling leakage through the thin tunnel oxide.

A conventional AND-type floating gate flash memory is suitable for many commercial applications because the memory device possesses the characteristics of high-density, low-power and fast speed programming. However, due to the inter-floating gate coupling effect, the scaling of AND-type floating gate devices is limited. When the space parameter for the floating gate device is shrunk, a high floating gate coupling effect may cause undesirable and severe disturbance. The conventional AND-type floating gate device also suffers from tunnel oxide scaling issues and erratic bits where a local defect or trapped charge, in a tunnel oxide can result in the leakage of the charge in the floating gate.

To address the scaling issue in floating gate devices, charge trapping devices such as SONOS, MNOS or nano-crystal trapping devices are suggested. However, these devices all suffer serious charge retention problems. For a SONOS device, the ultra-thin tunnel oxide is unable to properly preserve a charge storage. For a MNOS device, the structure does not provide a top oxide to block the charge loss. A nanocrystal device cannot be well-controlled because of the randomly distributed nano particles.

Accordingly, it is desirable to design AND-type floating gate flash memories that provide scalability while overcoming the retention problems as well as maintaining efficient hole tunneling erase.

SUMMARY OF THE INVENTION

The present invention provides a bandgap engineered SONOS (referred to as "BE-SONOS" or "SONONOS") device structure for design with various AND architectures to perform a source side injection (SSI) programming method. The BE-SONOS device structure comprises a spacer oxide disposed between a control gate overlaying an oxide-nitride-oxide-nitride-oxide ($O_3$—$N_2$—$O_2$—$N_1$—$O_1$) stack and a sub-gate overlaying a gate oxide. In a first embodiment, a BE-SONOS SG-AND (sub-gate-AND) array architecture is constructed multiple columns of SONONOS devices with sub-gate lines and diffusion bitlines. In a second embodiment, a BE-SONOS SGIB-AND (sub-gate-inversion-bitline-AND) architecture is constructed multiple columns of SONONOS devices with sub-gate inversion bitlines and with no diffusion bitlines.

Broadly state, an integrated circuit device comprises a semiconductor substrate; a plurality of memory cells on the semiconductor substrate, each memory cell having a spacer oxide disposed between a gate and a sub-gate, each gate overlaying a blocking oxide-charge storage layer-modulated tunnel dielectric stack, each sub-gate overlaying a gate oxide; and an N+ buried diffusion disposed in the semiconductor substrate and positioned underneath between a first gate oxide and a first blocking oxide-charge storage layer-modulated tunnel dielectric stack that serves as a first diffusion bitline.

Advantageously, the BE-SONOS AND array architectures of the present invention provides greater scalability over floating gate and AND type of memory devices. The present invention also advantageously provides a uniform and self-converging channel hole tunneling erase operation. Moreover, the present invention eliminates the inter-floating gate coupling effect. The present invention further provides desirable reliability properties including predictable characteristic of excellent charge retention, predictable number of nearly no erratic bits, and predicable small degradation after program and erase cycles.

The structures and methods regarding to the present invention are disclosed in the detailed description below. This summary does not purport to define the invention. The invention is defined by the claims. These and other embodiments, features, aspects, and advantages of the invention will become better understood with regard to the following description, appended claims and accompanying drawings.

DETAILED DESCRIPTION OF EMBODIMENTS OF THE INVENTION

Figure 1:
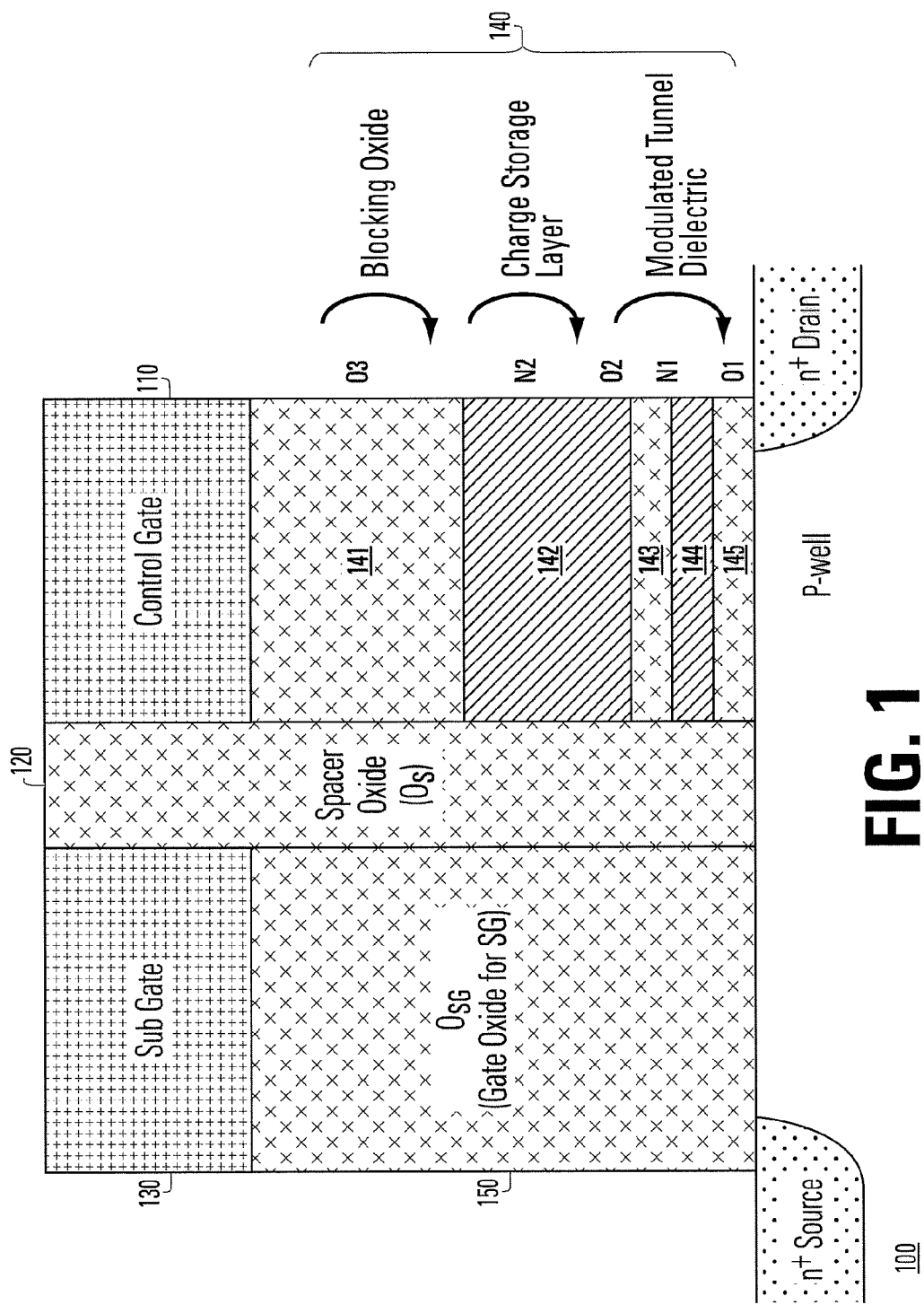
FIG. 1 is a structural diagram illustrating a cross-sectional view of a single cell structure of an n-channel BE-SONOS device with sub-gate in accordance with the present invention.

Referring now to FIG. 1, there is shown a structural diagram illustrating a cross-sectional view of a single cell structure of an n-channel BE-SONOS device 100 with sub-gate (SG). The n-channel BE-SONOS device 100 includes a spacer oxide (Os) 120 that is disposed between a control gate 110 and a sub-gate 130. An oxide-nitride-oxide-nitride-oxide ($O_3$—$N_2$—$O_2$—$N_1$—$O_1$) structure 140 is disposed underneath the control gate 110. A gate oxide $O_{SG}$ 150 is disposed underneath the sub-gate 130. The $O_3$—$N_2$—$O_2$—$N_1$—$O_1$ structure 140 includes a blocking oxide $O_3$ 141, a charge storage layer $N_2$ 142, and a modulated tunnel dielectric $O_2$—$N_1$—$O_1$ 143-145. The bottom $O_2$—$N_1$—$O_1$ 143-145 layers provide hole tunneling current and good data retention.

The n-channel BE-SONOS device 100 is a five-terminal device with two gates, the control gate 110 and the sub-gate 130. Underneath the control gate 110, there is the $O_3$—$N_2$—$O_2$—$N_1$—$O_1$ structure 140 for the charge storage. Underneath the sub-gate 130, there is the non-trapping gate oxide 150. The control gate 110 can control program, erase, and read the charge storage layer. The sub-gate 130 can provide source side injection (SSI) programming method. The source side injection is a low-power and high-speed programming method. The $O_1$—$N_1$—$O_2$ layer can be implemented with ultra-thin oxide and nitride, typically within 3 nm to provide hole direct tunneling. The N2 layer 142 is thicker than 5 nm to provide higher trapping efficiency. In the layer 141 formation method, one technique is to use a wet converted top oxide to provide a large density of traps at the interface between $O_3$ and $N_2$. The $O_3$ layer is typically thicker than 6 nm in order to prevent charge loss from top oxide. The $O_1$—$N_1$—$O_2$ layers serve as a tunneling dielectric for the hole tunneling.

An exemplary set of device parameters for the n-channel BE-SONOS device 100 with the sub-gate 130 is shown below.

| | |
|---|---|
| Bottom Oxide ($O_1$) | 15 A |
| Inter Nitride ($N_1$) | 20 A |
| Inter Oxide ($O_2$) | 18 A |
| Trapping Nitride ($N_2$) | 90 A |
| Gate Oxide for SG ($O_{SG}$) | 150 A |
| Spacer Oxide ($O_S$) | 200 A |
| Gate material | N+ - poly or P+ - poly gate |

Figure 2A:
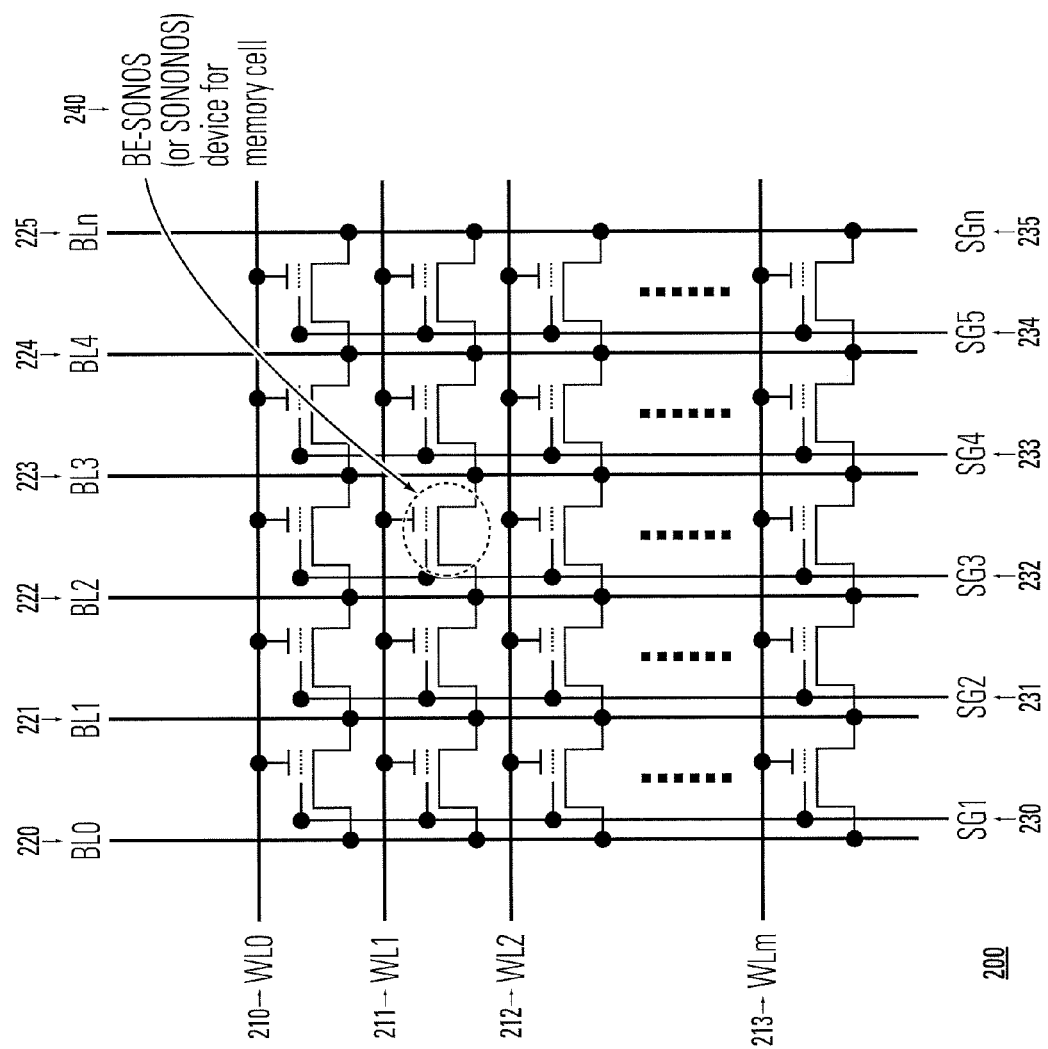
FIG. 2A is a circuit diagram illustrating a first embodiment of a BE-SONOS SG-AND array architecture with diffusion bitlines in accordance with the present invention.

In FIG. 2A, there is shown a circuit diagram illustrating a first embodiment of a BE-SONOS SG-AND array architecture 200 with diffusion bitlines. A plurality of SONONOS devices are connected in parallel to form the BE-SONOS SG-AND array architecture 200. The BE-SONOS array architecture 200 comprises a plurality of wordlines WL0 210, WL1 211, WL2 212, WLm 213 intersecting a plurality of bitlines BL0 220, BL1 221, BL2 222, BL3 223, BL4 224 and BLn 225. A corresponding sub-gate line is parallel and located nearby a bitline. A sub-gate SG1 230 is located adjacent to the bitline BL0 220. A sub-gate SG2 231 is located adjacent to the bitline BL1 221. A sub-gate SG3 232 is located adjacent to the bitline BL2 222. A sub-gate SG4 233 is located adjacent to the bitline BL3 223. A sub-gate SG5 234 is located adjacent to the bitline BL4 224. A sub-gate SGn 235 is located adjacent to the bitline BL5 225. A sample BE-SONOS (or SONONOS) device 240 that functions as a memory cell is shown in a circled area.

Figure 2B:
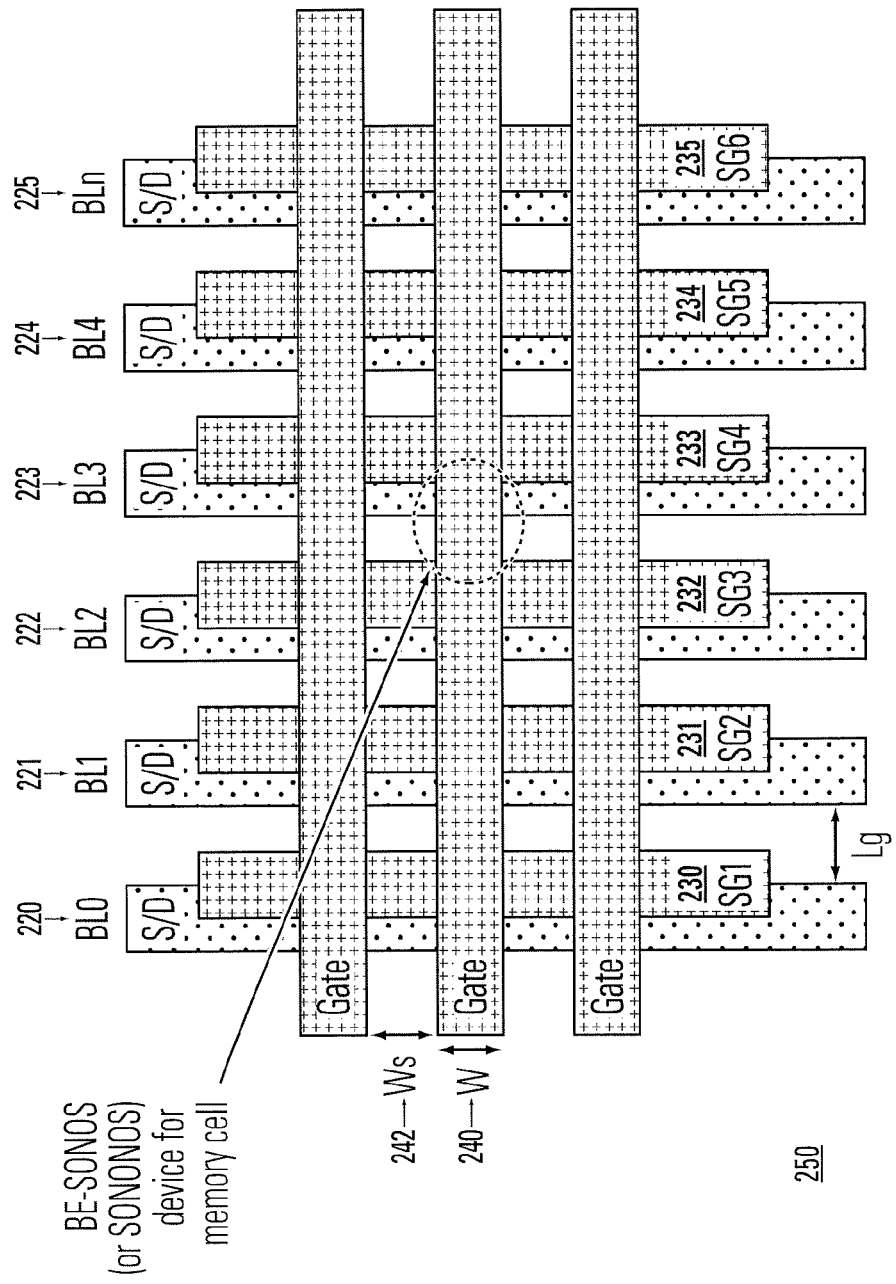
FIG. 2B is a layout diagram illustrating the first embodiment of the BE-SONOS SG-AND array architecture with diffusion bitlines in accordance with the present invention.

As shown in FIG. 2B, there is a layout diagram 250 illustrating the first embodiment of the BE-SONOS SG-AND array architecture 200 with diffusion bitlines. Although each sub-gate SG is in parallel with a corresponding bitline, each SG has a slight offset from the corresponding bitline, e.g. the SG1 230 is positioned slightly to the right of BL0 220. Every bitline can either serve as a source or a drain. Each SG is positioned between two bitlines, e.g. the SG1 230 between BL0 220 and BL1 221. Each bitline in the BL0 220, BL1 221, BL2 222, BL3 223, BL4 224, and BL5 225 can function as a source region or a drain region. Therefore, the SG1 230 is disposed between the source region in the BL0 220 and the drain region in the BL1 221. The parameters W 240 and Ws 242 are approximately equal to the parameter F, where the parameter F denotes the critical dimension in a technology node. For example, the parameter F is equal to 50 nm for a 50 nm node.

Figure 3A:
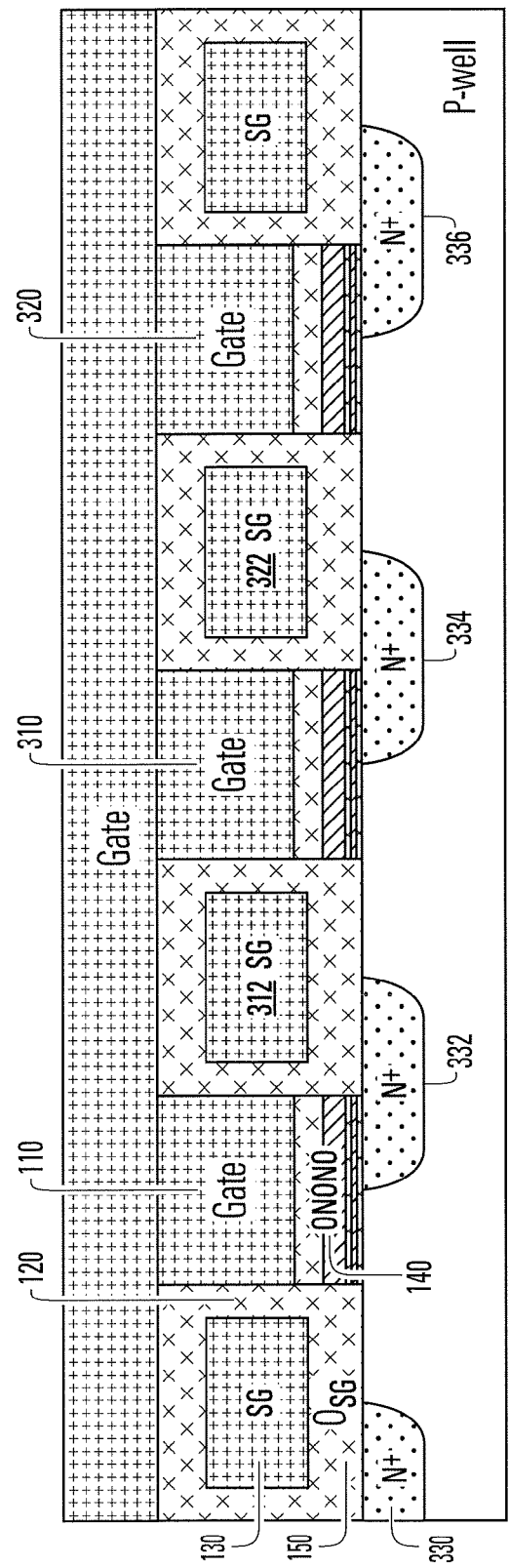
FIG. 3A is a layout diagram illustrating a cross-sectional view in channel length direction of the BE-SONOS SG-AND array architecture in the first embodiment in accordance with the present invention.

FIG. 3A is a layout diagram 300 illustrating a cross-sectional view in channel length direction of the BE-SONOS SG-AND array architecture in the first embodiment. The spacer oxide 120 separates the control gate 110 and the sub-gate 130. The $O_3$—$N_2$—$O_2$—$N_1$—$O_1$ structure 140 is disposed underneath the control gate 110. The gate oxide $O_{SG}$ 150 is disposed underneath the gate 130. A suitable implementation of the control gate 110 is poly-1, and a suitable implementation of the sub-gate 130 is poly-2. N+ buried diffusion (BD) wells 330, 332, 334 and 336 are implemented for diffusion bitlines (BLs). In the layout diagram 300, a first cell structure comprises the control gate 110 and the sub-gate 130, with an adjacent and second cell structure that comprises a gate 310 and a sub-gate 312, with an adjacent and third cell structure that comprises a gate 320 and a sub-gate 322.

Figure 3B:
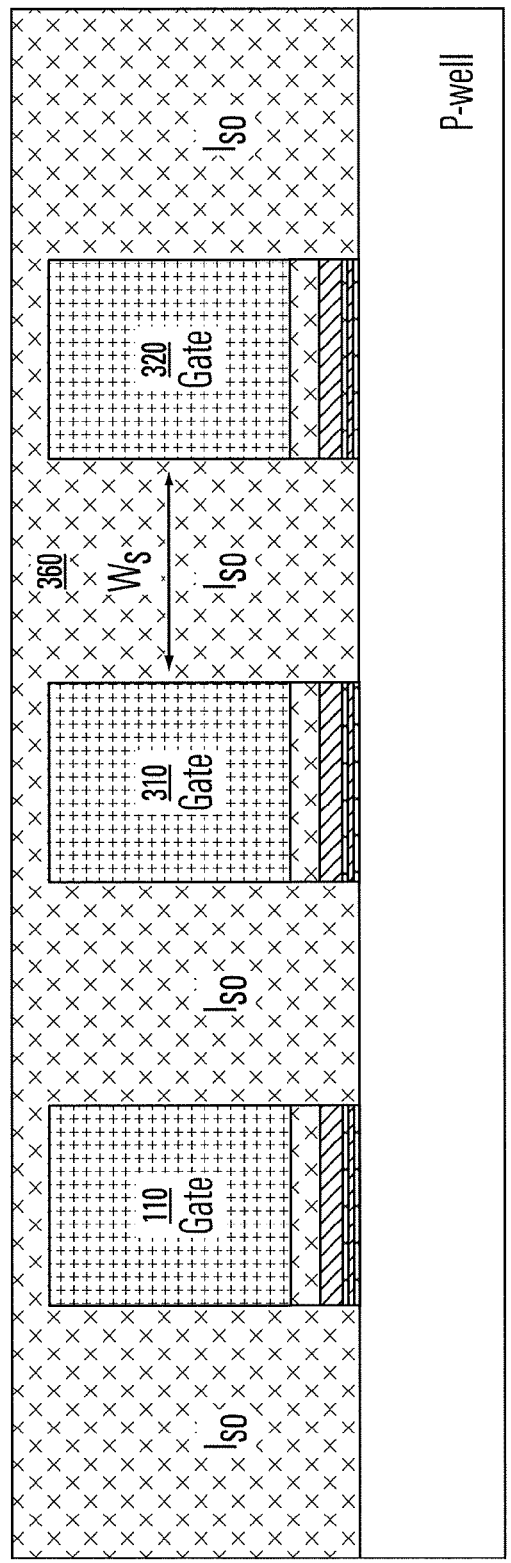
FIG. 3B is a layout diagram 350 illustrating a cross-sectional view in channel width direction of the BE-SONOS SG-AND array architecture in the first embodiment in accordance with the present invention.

In FIG. 3B, there is shown a layout diagram 350 illustrating a cross-sectional view in channel width direction of the BE-SONOS SG-AND array architecture in the first embodiment. The gap between the gate 310 and the gate 320 is denoted by a parameter Ws 360 which provides isolation between the gate 310 and the gate 320. Other similar isolations are shown between two gates to provide an isolation between two gates. The pitch in the channel width direction is approximately equal to 2F smaller than that in channel length direction 3F caused by a diffusion bitline. Therefore, the BE-SONOS SG-AND architecture is approximately equal to $6F^2$ per cell.

Figure 4A:
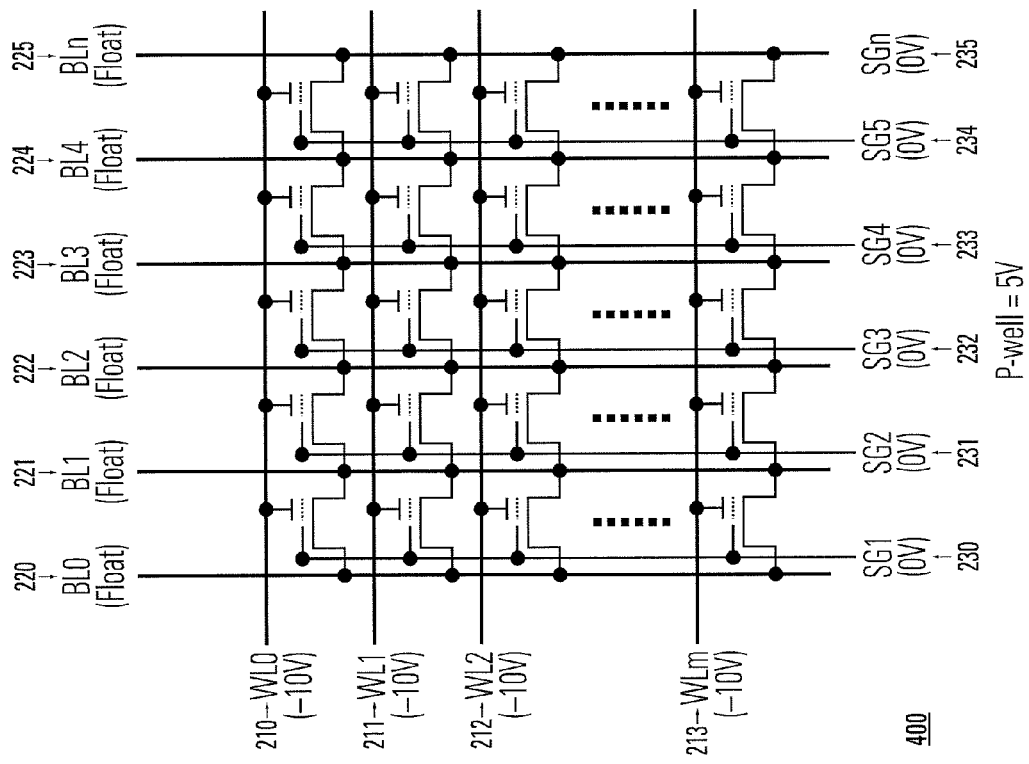
FIG. 4A is a circuit diagram illustrating an electrical reset for the SONONOS SG-AND array architecture in the first embodiment in accordance with the present invention.
Figure 4B:
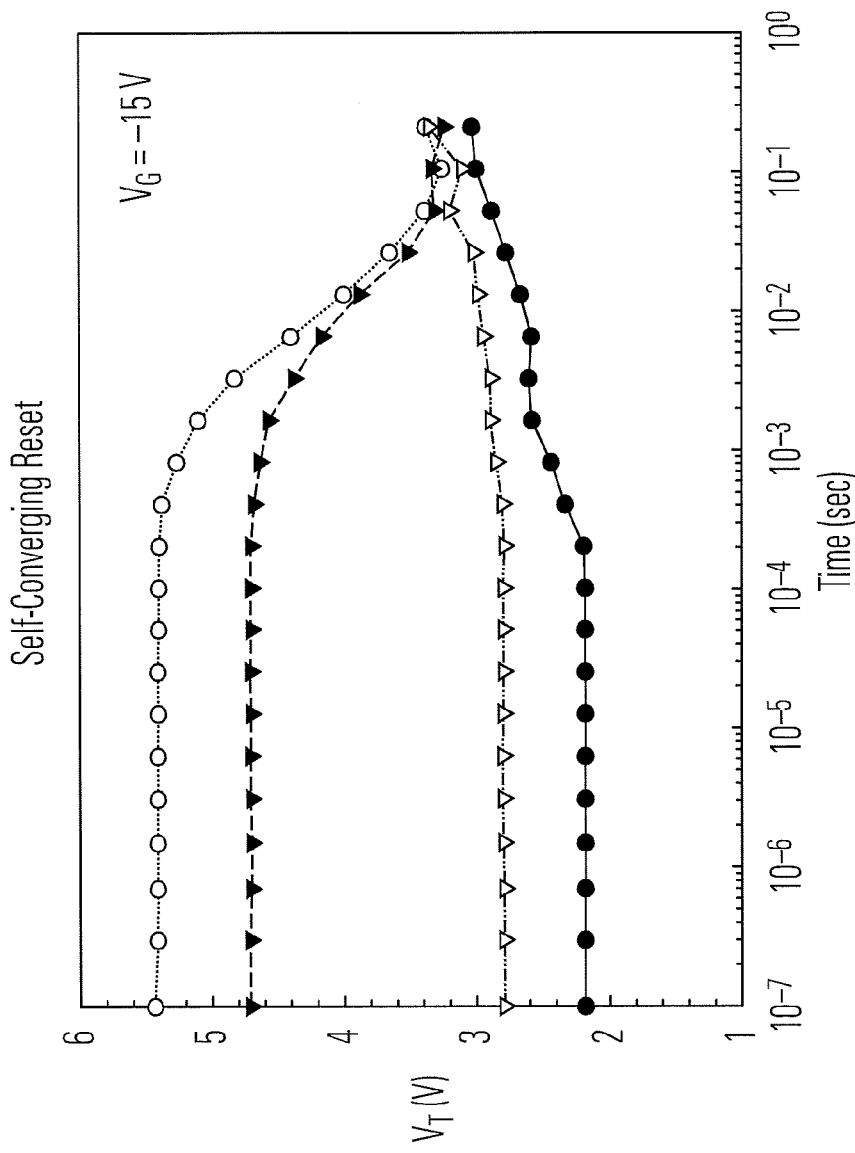
FIG. 4B is a graphical diagram illustrating a waveform of a self-converging reset in the first embodiment in accordance with the present invention.

FIG. 4A is a circuit diagram 400 illustrating an electrical reset for the SONONOS SG-AND array architecture of the first embodiment. During the electrical reset, the wordlines (or gates) WL0 210, WL1 211, WL2 212, and WLm 213 are set to —10 volts, the bitlines BL0 220, BL1 221, BL2 222, BL3 223, BL4 224 and BL5 225 are left floating, and the sub-gates SG1 230, SG2 231, SG3 232, SG4 233, SG5 234, and SGn 235 are set to 0 volt. In one embodiment, the odd number sub-gates are electrically connected together, including SG1 230, SG3 232 and SG5 234, while the even number sub-gates are electrically connected together, including SG2 231, SG4 233 and SGn 235. Before operations, the memory circuit 400 is reset by applying Vgb=−15V (or partition the gate voltage into each WL and p-well), which produces a desirable self-converging property, as shown in a graph 450 in FIG. 4B. Even if the BE-SONOS device is initially charged to various Vt, the reset operation can tighten these initial points to the reset/erase state. A typical reset time is around 100 msec. In one example, the n-channel BE-SONOS with ONONO=15/20/18/70/90 Angstrom, and a N+-poly gate. Lg/W=0.22/0.16 um.

To state in another way, a reset operation is carried out to tighten the Vt distribution before operations. In contrast to a floating gate device where there is no self-converging erase, the BE-SONOS provides a self-converging erase reset/erase methods, which is necessary because the initial Vt distribution is often widely distributed due to the process issues, such as plasma charging effect. The self-converging reset assists in tighten the initial Vt distribution.

Figure 5A:
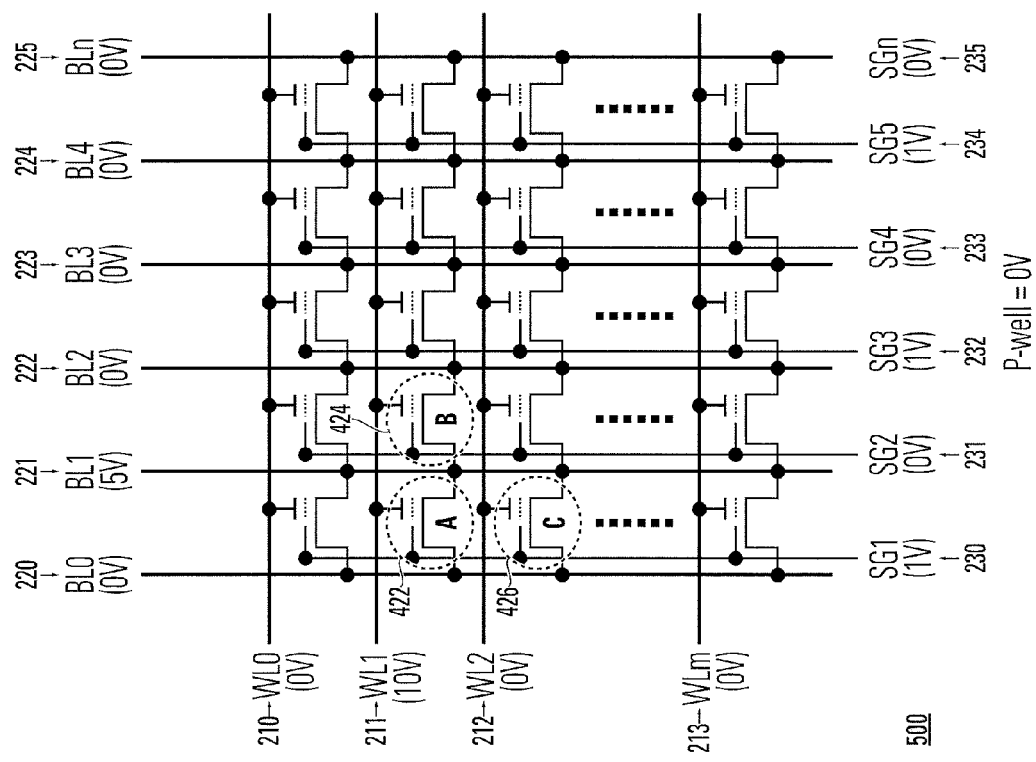
FIG. 5A is a circuit diagram illustrating an electrical program for the SONONOS SG-AND array architecture in the first embodiment in accordance with the present invention.
Figure 5B:
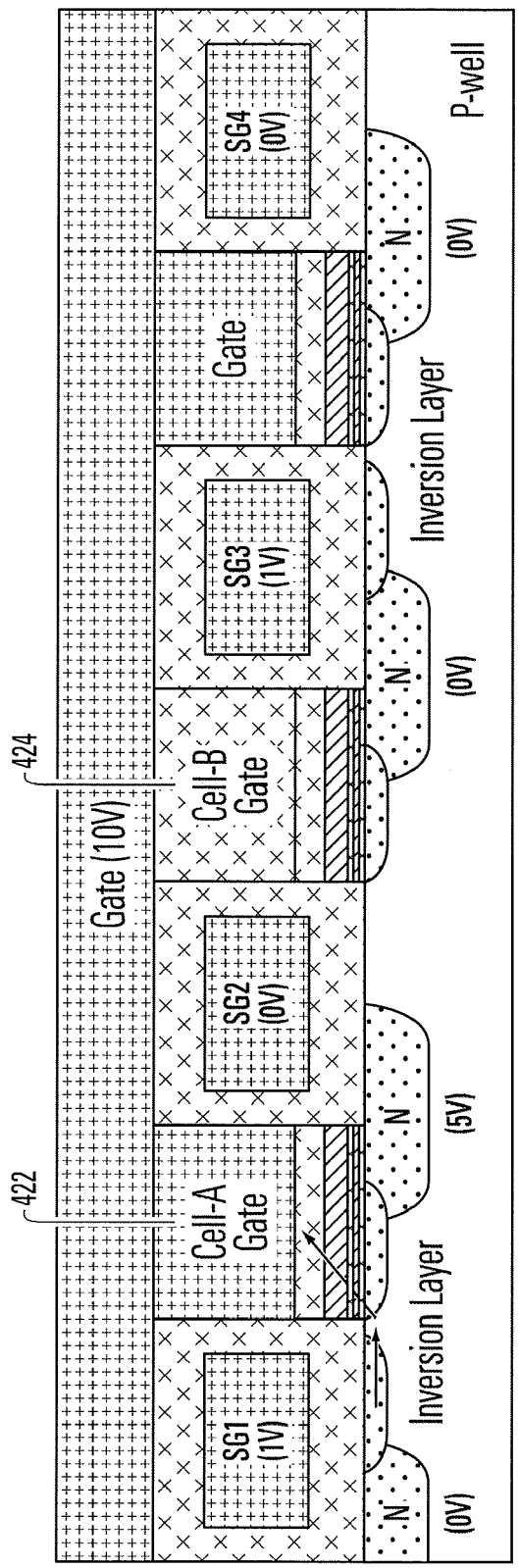
FIG. 5B is a layout diagram illustrating the electrical program for the SONONOS SG-AND array architecture in the first embodiment in accordance with the present invention.

FIG. 5A is a circuit diagram 500 illustrating an electrical program for the SONONOS SG-AND array architecture in the first embodiment, while FIG. 5B is a layout diagram 550 illustrating the electrical program for the SONONOS SG-AND array architecture in the first embodiment. In one example during electrical program, the wordline WL1 211 is set to 10 volts while the other wordlines WL0 210, WL2 212, and WLm 213 are set 0 volt. The bitline BL1 221 is set to 5 volts, and the bitlines BL0 220, BL2 222, BL3 223, BL4 224, and BLn 225 are set to 0 volt. The odd number sub-gates SG1 230, SG3 232 and SG5 234 are set to 1 volt, while the even number sub-gates SG2 231, SG4 233, and SOn 235 are set to 0 volt. The bitlines BL0 220, BL1 221, BL2 222, BL3 223, BL4 224 and BL5 225 provide a greater flexibility in programming than sub-gates SG1 230, SG2 231, SG3 232, SG4 233, SG5 234, and SGn 235 because each bitline can be independently programmed, while the sub-gates are programmed based on the even number or odd number of sub-gates. One type of electrical programming method is a source side injection. The source side injection programs a cell to a high voltage threshold Vt state. For example, the source injection applies Vg=10V to the selected WL1, Vg=0V to other wordlines, SG=1V for programming, and SG=0V for inhibition. The voltage setting of the SG voltage at 1 volt is intended as an illustration such that in general it is typically 0.5 to 2 volts higher than the threshold voltage under SG gate.

When a cell-A 422 is selected programming, the SG is set to 1 volt so that the channel underneath SG is slightly turned on. Electrons are injected into the cell-A 422 by source side injection method to make the voltage threshold, Vt, higher than PV. The SG for a cell-B 424 is set to 0 volt which turns SG off so that there is no injection into the cell-B 424. As for a cell-C 426, the SG is set to 1 volt where the WL=0 volt which turns off cell-C 426 so that there is also no injection into the cell-C 426. As a result, programming can be randomly selected with adequate program inhibit technique.

To carry out an electrical program, the selected wordline is applied a high voltage, 10 volts, and the sub-gate is applied 1 volt to perform a source side injection. The source side injection is a low-power and high-speed programming method. One of skill in the art should recognize that parallel programming methods such as page programming with 2 kB cells in parallel can burst the programming throughput to more than 10 MB per second while the cell current consumption can be controlled within 2 mA. To avoid program disturbance to other bitlines, the sub-gate SG2 231 is set to 0 volt and turns off the inhibit cell.

Figure 6A:
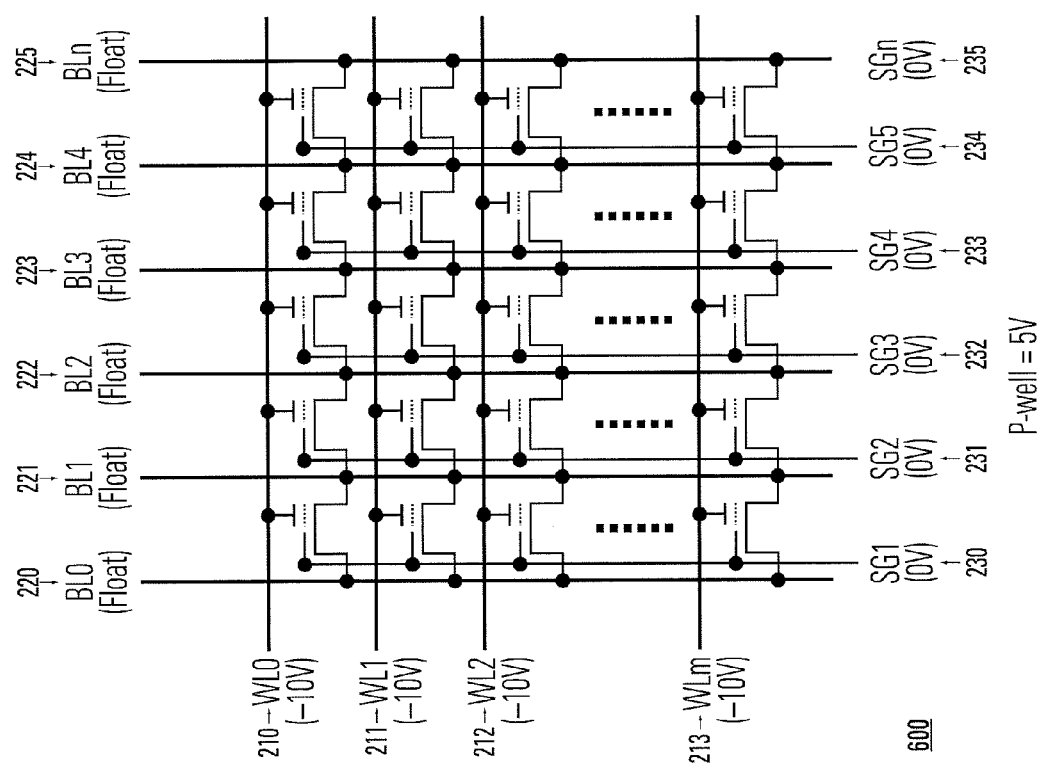
FIG. 6A is a circuit diagram illustrating an electrical erase for the SONONOS SG-AND array architecture of the first embodiment in accordance with the present invention.
Figure 6B:
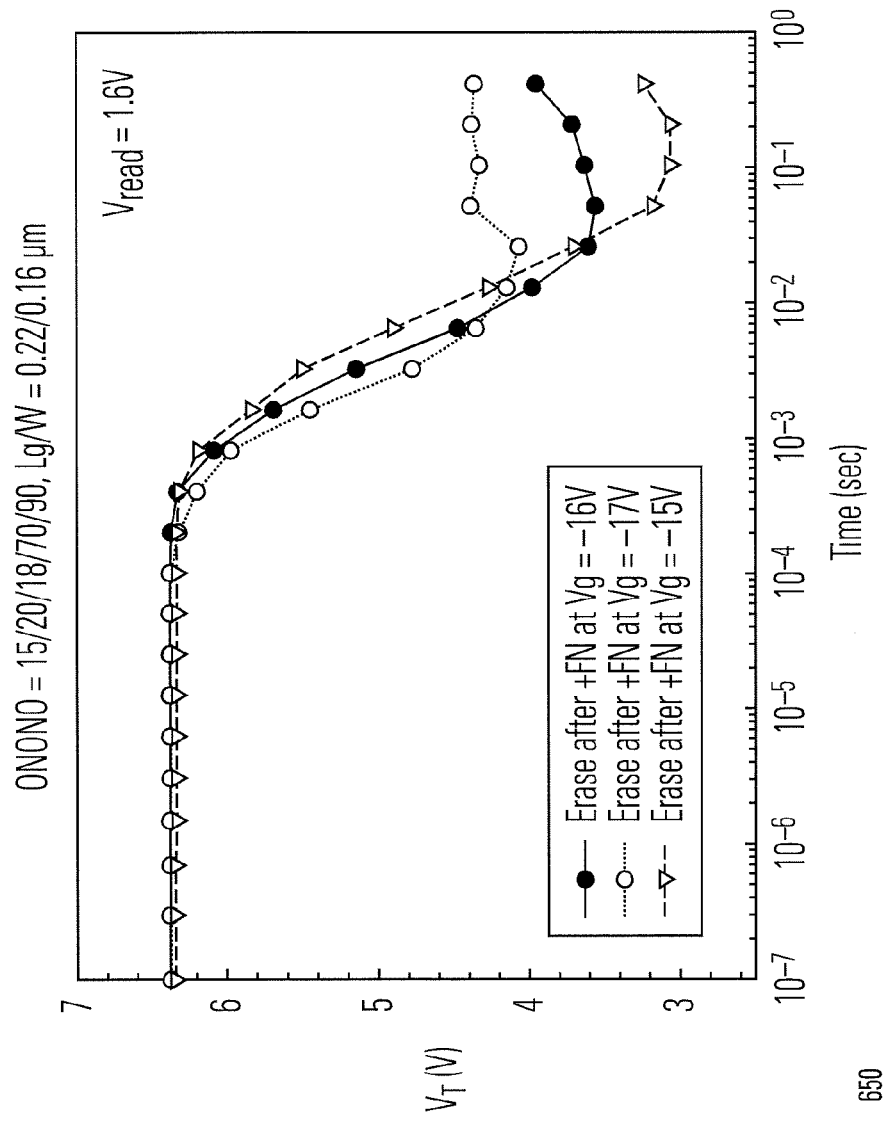
FIG. 6B is a graphical diagram illustrating a waveform of a self-converging erase in accordance with the present invention.

As illustrated in FIG. 6A, there is a circuit diagram 600 showing an electrical erase for the SONONOS SG-AND array architecture in the first embodiment. The erase operation is executed similar to the reset operation. During electrical erase, the wordlines WL0 210, WL1 211, WL2 212, and WLm 213 are set to −10 volts, the bitlines BL0 220, BL1 221, BL2 222, BL3 223, BL4 224 and BL5 225 are left floating, and the sub-gates SG1 230, SG2 231, SG3 232, SG4 233, SG5 234, and SGn 235 are set to 0 volt. The erase operation is performed in the unit of a sector or block. The BE-SONOS device produces desirable self-converging erase property, as shown in a graph 650 in FIG. 6B. The erase saturation Vt is dependent on the parameter Vg. A higher Vg causes a higher saturated Vt. The convergent time is typically around 10 to 100 msec.

Figure 7:
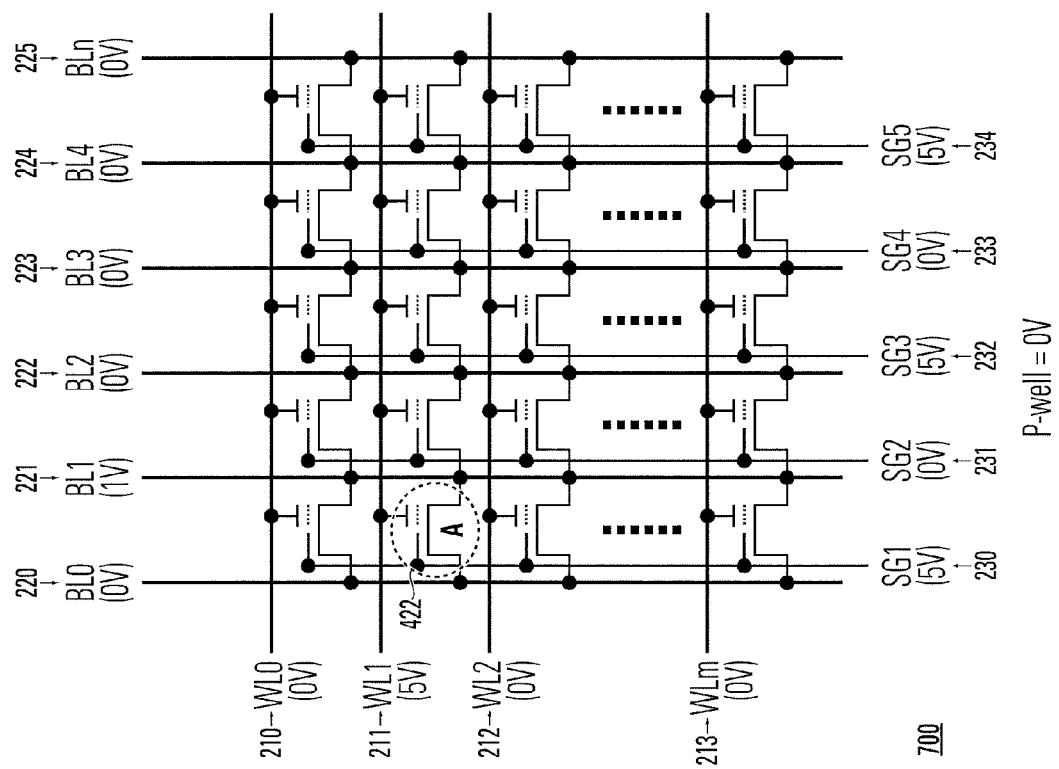
FIG. 7 is a circuit diagram illustrating a read operation for the SONONOS SG-AND array architecture in the first embodiment in accordance with the present invention.

FIG. 7 is a circuit diagram 700 illustrating a read operation for the SONONOS SG-AND array architecture in the first embodiment. In one example during a read operation of the cell-A 422, the wordline WL1 211 is set to 5 volts while the other wordlines WL0 210, WL2 212, and WLm 213 are set 0 volt. The bitline BL1 221 is set to 1 volt, and the bitlines BL0 220, BL2 222, BL3 223, BL4 224, and BLn 225 are set to 0 volt. The odd number sub-gates SG1 230, SG3 232 and SG5 234 are set to 3 volts, while the even number sub-gates SG2 231 and SG4 233 are set to 0 volt. A read operation is performed by applying a gate voltage that is between an erased state Vt (EV) and a programmed state Vt (PV). The gate voltage is typically around 5 volts. Alternatively, the gate voltage can be selected to be more than 5 volts or less than 5 volts, provided the gate voltage falls in the range of a high Vt value and a low Vt value. If Vt of the cell-A 422 is higher than 5 volts, then the read current is likely to be a very small value (e.g., <0.1 μA). If Vt of the cell-A 422 is less than 5 volts, the read current is likely to be a high value (e.g., >0.1 μA).

The applied voltage at a bitline (BL) is typically around 1 volt. A larger read voltage will induce more current, but the read disturbance may be larger. The WL number of SG-AND string is typically 64, 128, or 256. A larger number of SG-AND string may save more overhead and increase the array efficiency. However, the program distribution may be larger. A trade-off is weighed in choosing an adequate number of SG-AND string.

Although the above read function describes a random access read operation, one of ordinary skill in the art should recognize that a page read of multiple cells are possible without departing from the spirits of the present invention.

Figure 8A:
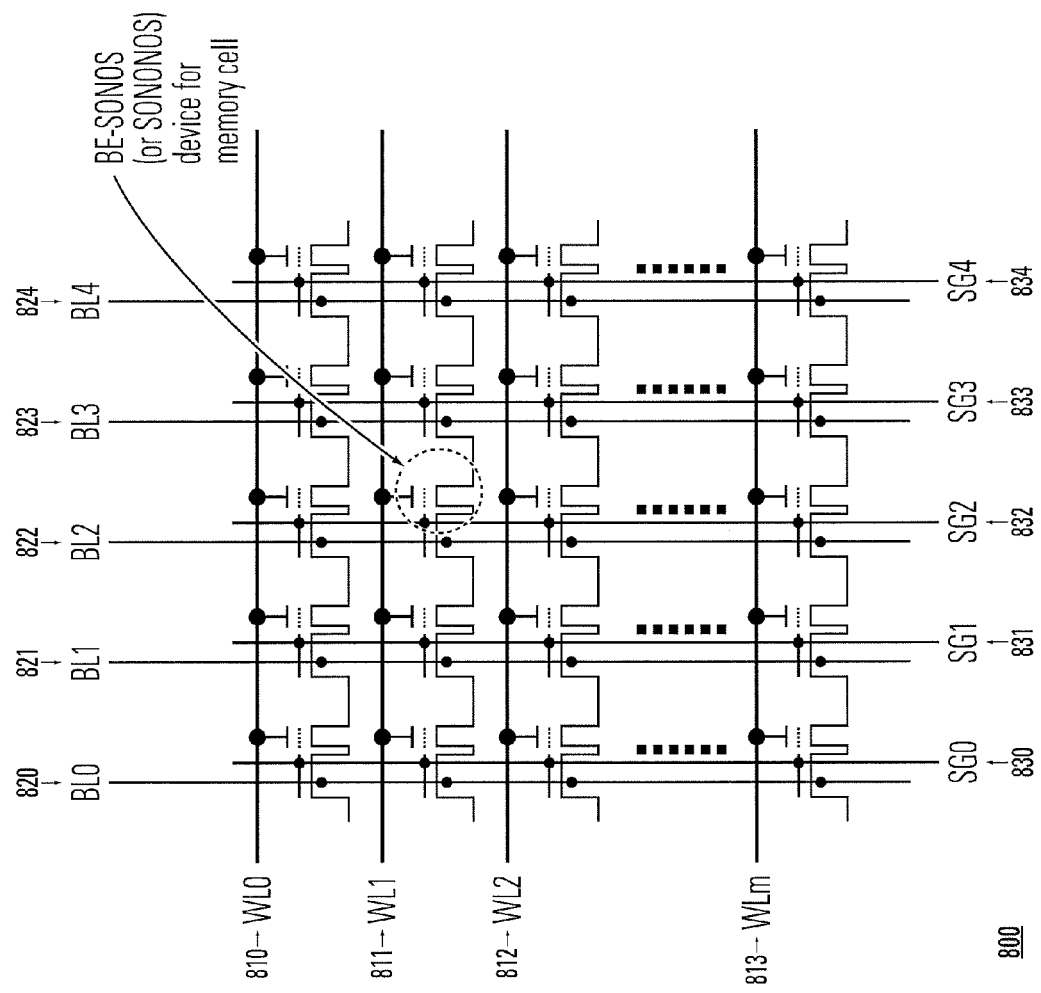
FIG. 8A is a circuit diagram illustrating a second embodiment of a BE-SONOS SGIB-AND array architecture in accordance with the present invention.
Figure 8B:
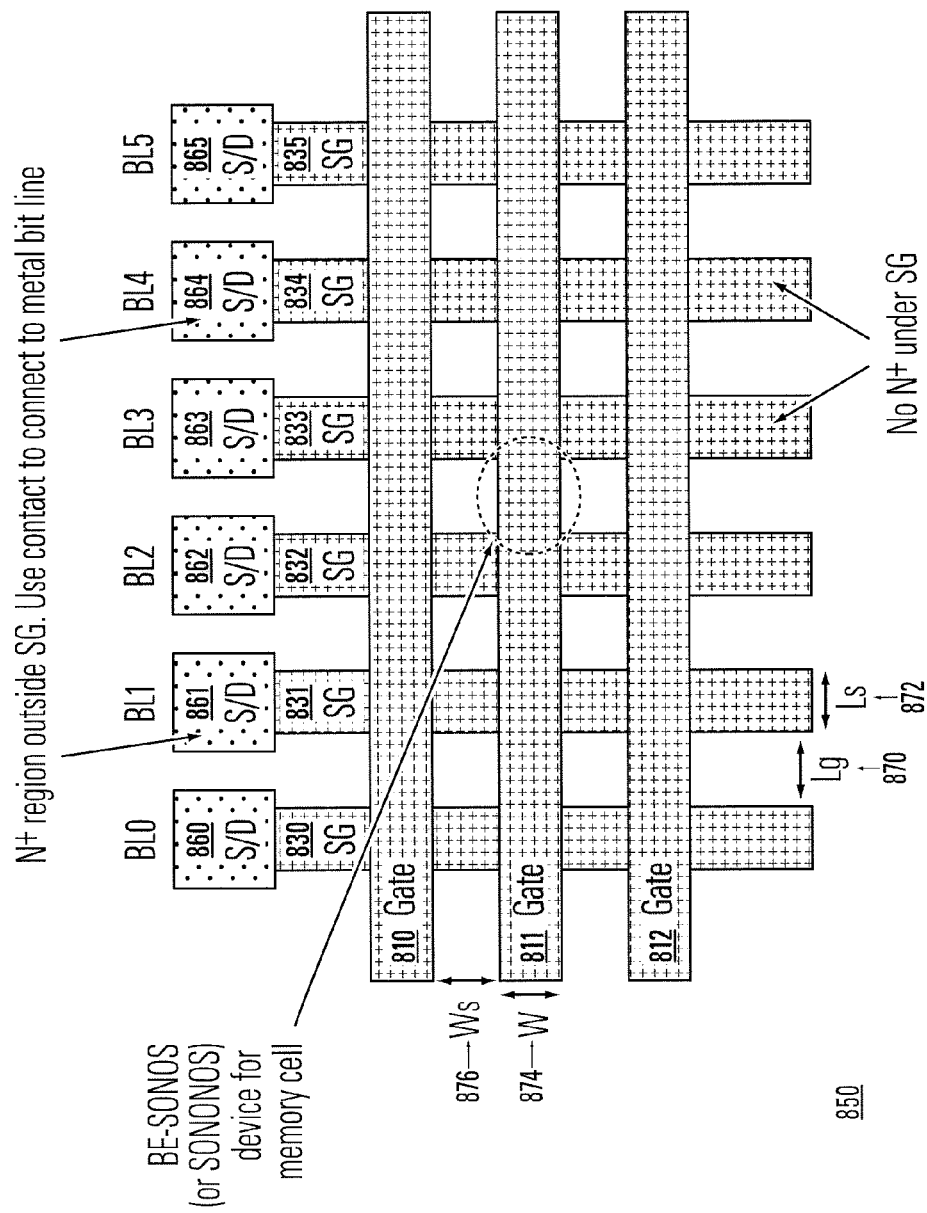
FIG. 8B is a layout diagram illustrating the second embodiment of the BE-SONOS SGIB-AND array architecture in accordance with the present invention.

Turning now to FIG. 8A, there is shown a circuit diagram 800 illustrating a second embodiment a BE-SONOS (or SONONOS) SGIB-AND (Sub-gate Inversion Bitline-AND) array architecture, while FIG. 8B is a layout diagram 850 illustrating the second embodiment of the BE-SONOS SGIB-AND array architecture. The term SGIB means that a bitline is formed from an inversion layer by turning on a sub-gate. Unlike the first embodiment where the BE-SONOS structure as shown in the layout diagram 300 has a N+ buried diffusion, the SONOS SGIB-AND cell structure has no N+ buried diffusion, as shown in FIG. 9, and therefore, there is no offset between a bitline and a sub-gate. The SONONOS devices are connected in parallel to form an AND array with SG in which there are no diffusion bitlines.

The BE-SONOS array architecture 800 comprises a plurality of wordlines WL0 810, WL1 811, WL2 812, WLm 813 intersecting a plurality of bitlines BL0 820, BL1 821, BL2 822, BL3 823 and BL4 824. A corresponding sub-gate line is parallel to each bitline. A sub-gate SG0 830 is placed in parallel to the bitline BL0 820. A sub-gate SG1 831 is placed in parallel to the bitline BL1 821. A sub-gate SG2 832 is placed in parallel to the bitline BL2 822. A sub-gate SG3 833 is placed in parallel to the bitline BL3 823. A sample BE-SONOS (or SONONOS) device 840 that functions as a memory cell is shown in a circled area.

In the SGIB-AND array architecture 850, every fourth sub-gates are commonly electrically connected, i.e. the SG0 830, SG4 834, SG8, etc. are electrically connected together, the SG1 831, SG5, SG9, etc are electrically connected together, the SG2 832, SG6, SG10, etc are electrically connected together, and the SG3 833, SG7, SG11, etc are electrically connected together.

As shown in the layout diagram 850 in FIG. 8B, there are no N+ region underneath each of the SG0 830, the SG1 831, the SG 832, the SG3 833, the SG4 834, and the SG 835 in the memory array of the SGIB-AND architecture 800. The overall dimension of a cell size in the SGIB-AND architecture 800 is reduced relative to a cell size as shown in the SG-AND array architecture 200 in FIG. 2A.

When the SG0 830, the SG1 831, the SG2 832, the SG3 833, the SG4 834, and the SG 835 are turned on, each creates an N-channel inversion layer, which effectively serves as a barrier diffusion layer to function, respectively, as a source/drain 860, a source/drain 861, a source/drain 862, a source/drain 863, a source/drain 864 and a source/drain 865. Each sub-gate in the SG0 830, the SG1 831, the SG2 832, the SG3 833, the SG4 834, and the SG 835 therefore serves dual functions. The first function that each sub-gate in the SG0 830, the SG1 831, the SG2 832, the SG3 833, the SG4 834, and the SG 835 serves is a sub-gate for a source side injection programming. The second function that each sub-gate in the SG0 830, the SG1 831, the SG2 832, the SG3 833, the SG4 834, and the SG 835 serves is an inversion bitline when a subgate is turned on. Each source/drain in the source/drain 860, the source/drain 861, the source/drain 862, the source/drain 863, the source/drain 864, and the source/drain 865 is for connecting to a metal bitline. The symbol Lg 870 denotes the drawn channel length. The symbol W 874 denotes the channel width. Typically, the parameters W 874, Ws 876, Lg 870, Ls 872 are approximately equal to the parameter F, where the parameter F represents the critical dimension in a technology node. For example, the parameter F is equal to 50 nm for a 50 nm node.

Figure 9A:
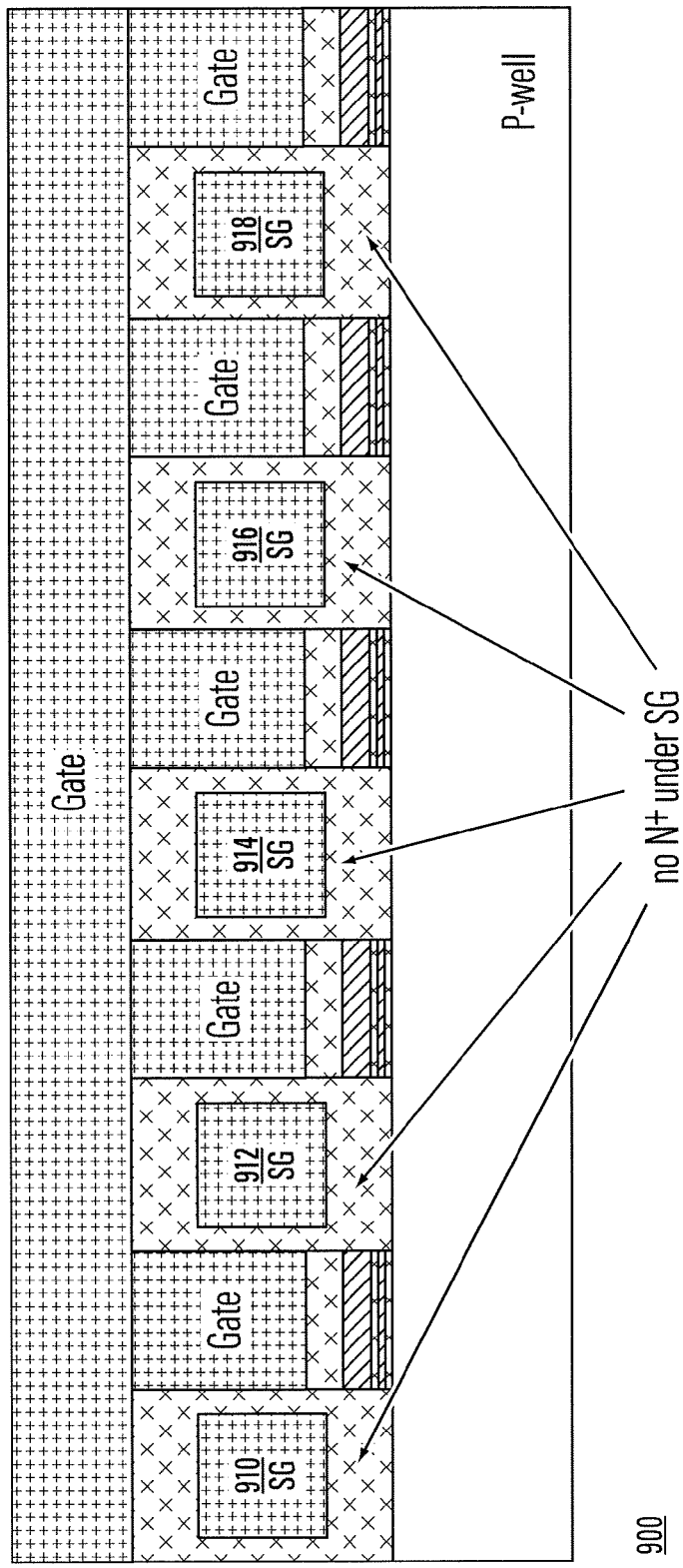
FIG. 9A is a layout diagram illustrating the cross sectional view in channel length direction of the SONONOS SGIB-AND array architecture in the second embodiment in accordance with the present invention.
Figure 9B:
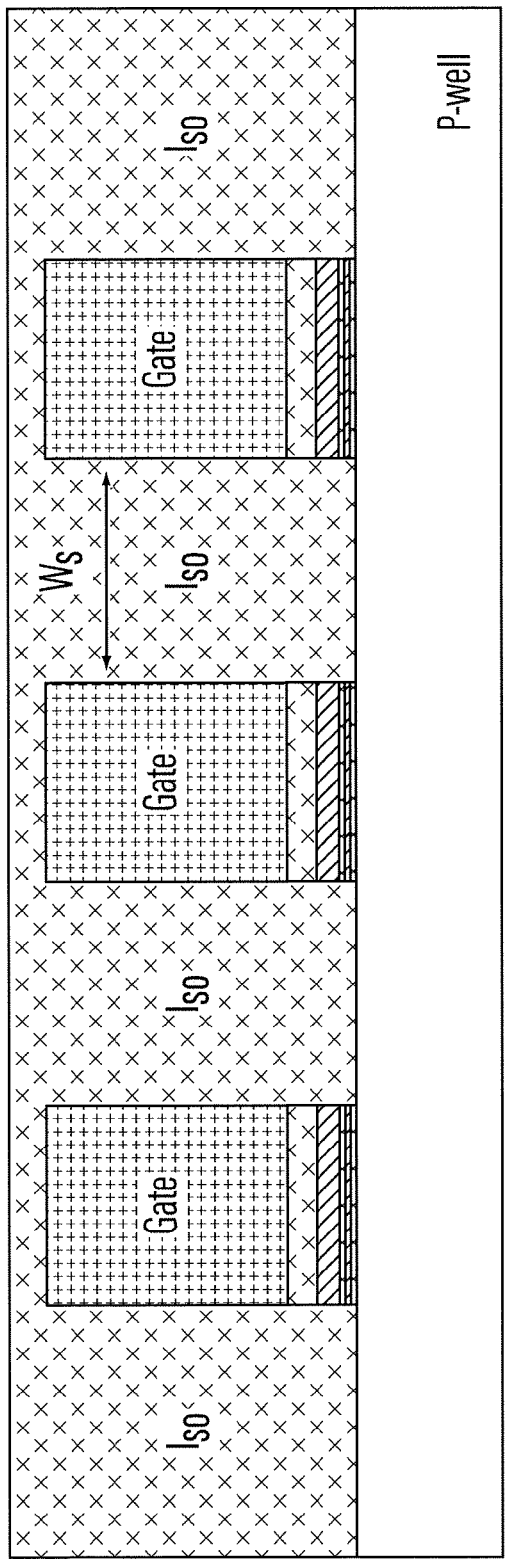
FIG. 9B is a layout diagram illustrating the cross sectional view in channel width direction of the SONONOS SGIB-AND array architecture in the second embodiment in accordance with the present invention.

As shown in FIG. 9A, there is a layout diagram 900 illustrating the cross sectional view in channel length direction of the SONONOS SGIB-AND array architecture in the second embodiment, while FIG. 9B is a layout diagram illustrating the cross sectional view in channel width direction of the SONONOS SGIB-AND array architecture in the second embodiment. Each subgate SG in SG 910, SG 912, SG 914, SG 916 and SG 918 has no implant of source region or drain region, which means that there is no N+ region underneath each subgate SG in SG 910, SG 912, SG 914, SG 916 and SG 918. The pitch in a channel width direction is approximately equal to that in a channel length direction 2F. Therefore, the BE-SONOS SGIB-AND architecture is approximately equal to $4F^2$ per cell.

Figure 10A:
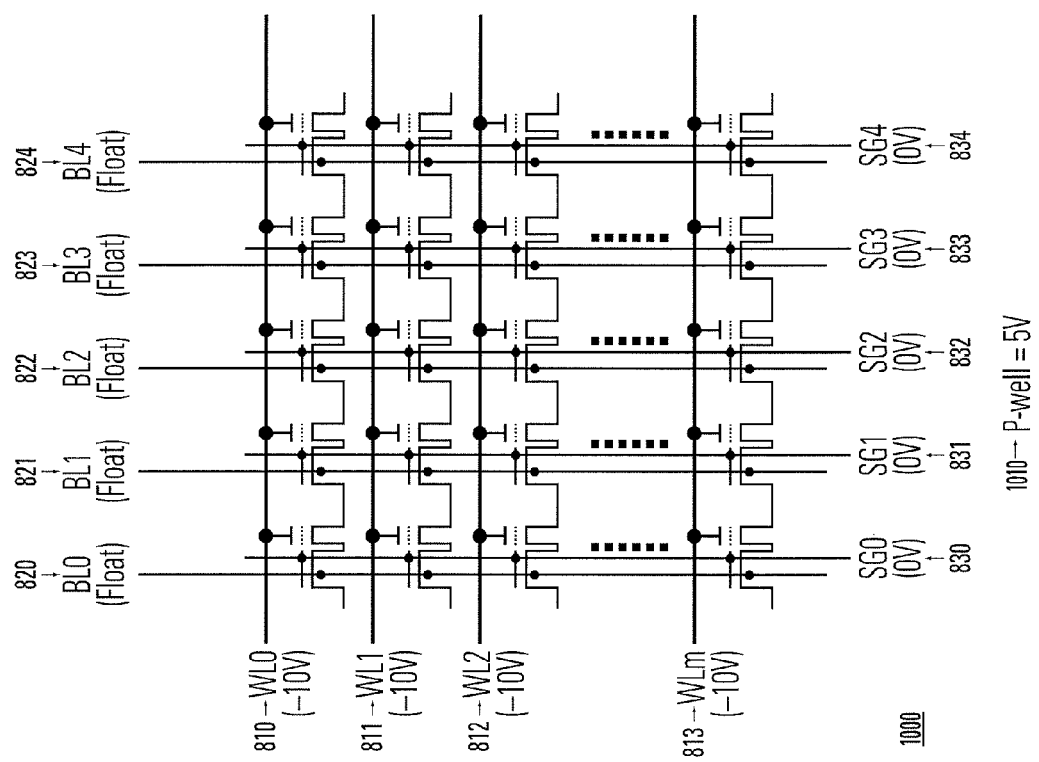
FIG. 10A is a circuit diagram illustrating an electrical reset of the SONONOS SGIB-AND array architecture in the second embodiment in accordance with the present invention.

In FIG. 10A, there is a circuit diagram illustrating an electrical reset of the SONONOS SGIB-AND array architecture 1000 in the second embodiment. During the electrical reset, the wordlines (or gates) WL0 810, WL1 811, WL2 812, and WLm 813 are set to −10 volts, the bitlines BL0 820, BL1 821, BL2 822, BL3 823, BL4 824 and BL5 825 are left floating, the sub-gates SG0 830, SG1 831, SG2 832, SG3 833, SG4 834, and SGn 835 are set to 0 volt, and P-well 1010 is set to 5 volts. When a sub-gate SG=is equal to zero volt, that means the SG is not turned on so that there is no inversion bitline. In one embodiment, every fourth sub-gates are connected together such that SG0 830 is connected to SG4, SG1 831 is connected to SG5, and so on.

Figure 10B:
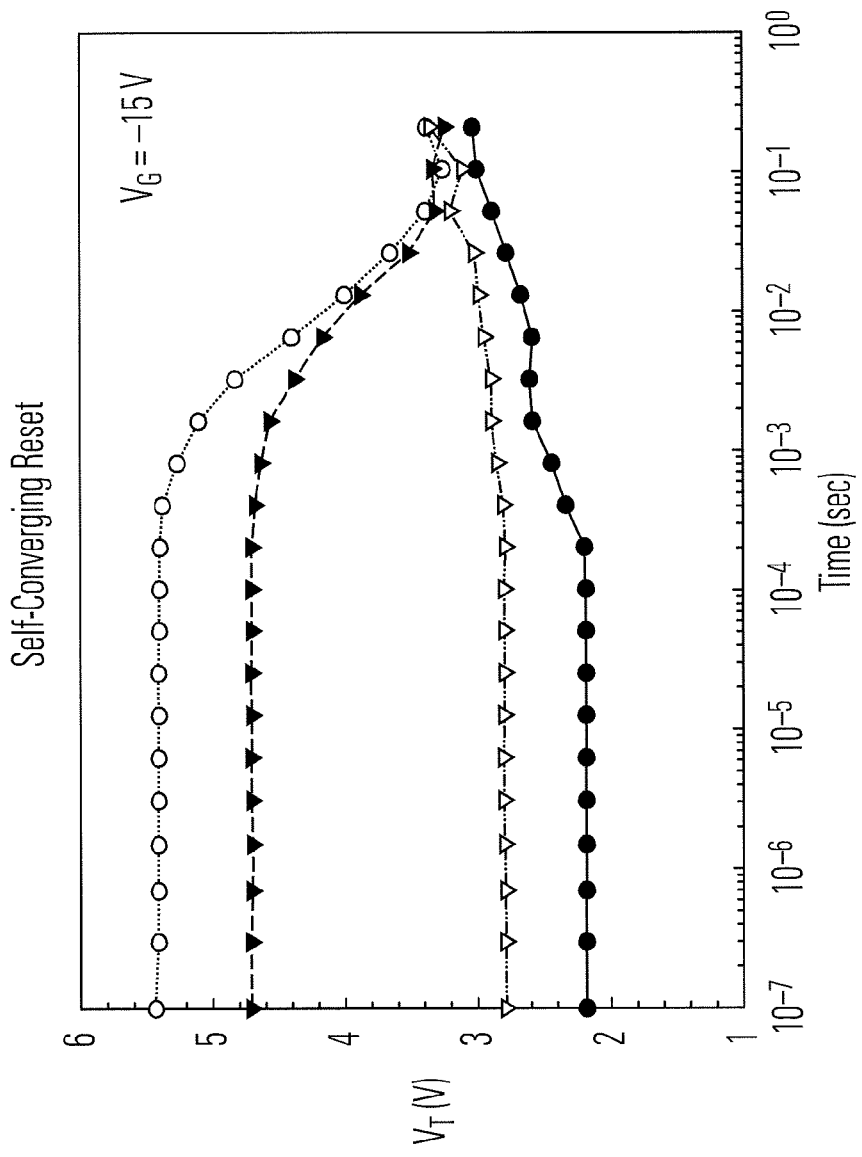
FIG. 10B is a graphical diagram illustrating a waveform of a self-converging reset in accordance with the present invention.

Before operations, the memory circuit 1000 is reset by applying Vgb=−15V (or partition the gate voltage into each WL and p-well), which produces a desirable self-converging property, as shown in the graph 1050 in FIG. 10B. Various circles and triangles in the graph 1050 represent different initial points over a wide distribution where these points converges to a threshold voltage Vt. Even if the BE-SONOS device is initially charged to various Vt, the reset operation can tighten these initial points to the reset/erase state. A typical reset time is around 100 msec. In one example, the n-channel BE-SONOS device with ONONO=15/20/18/70/90 Angstrom, and a N+-poly gate. Lg/W=0.22/0.16 um.

To phrase in another way, a reset operation is carried out to tighten the Vt distribution before operations. In contrast to a floating gate device where there is no self-converging erase, the BE-SONOS provides a self-converging erase reset/erase methods, which is necessary because the initial Vt distribution is often widely distributed due to the process issues, such as plasma charging effect. The self-converging reset assists in tighten the initial Vt distribution.

Figure 11A:
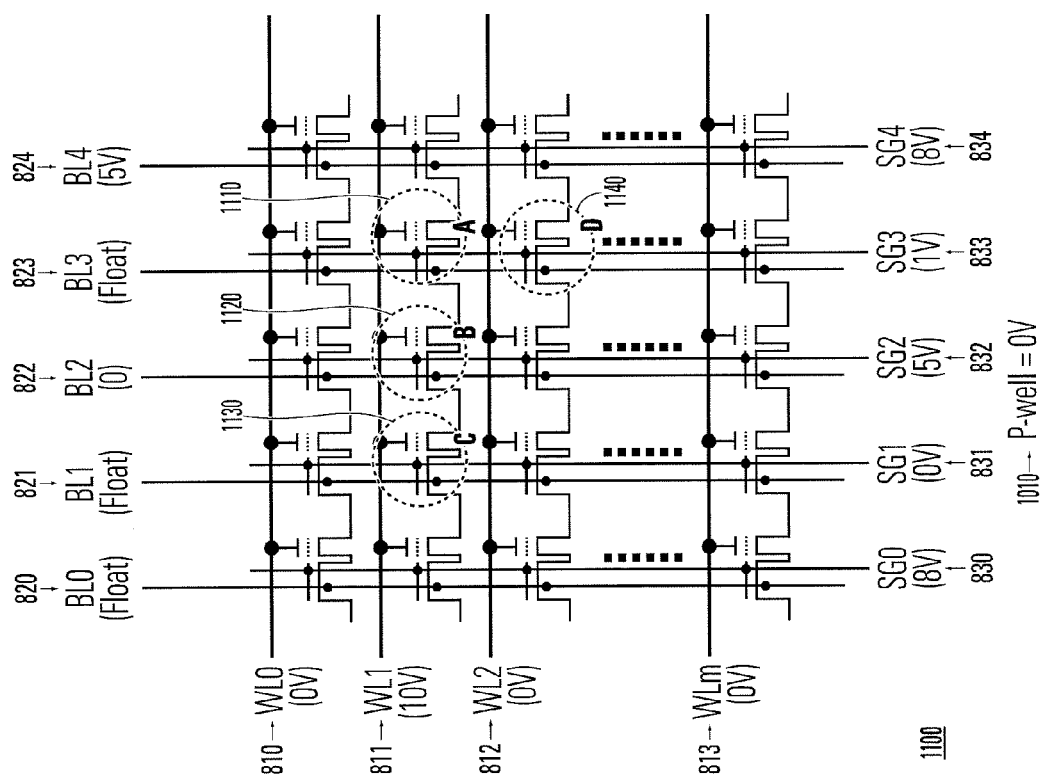
FIG. 11A is a circuit diagram illustrating an electrical program of the SONONOS SGIB-AND array architecture in the second embodiment in accordance with the present invention.
Figure 11B:
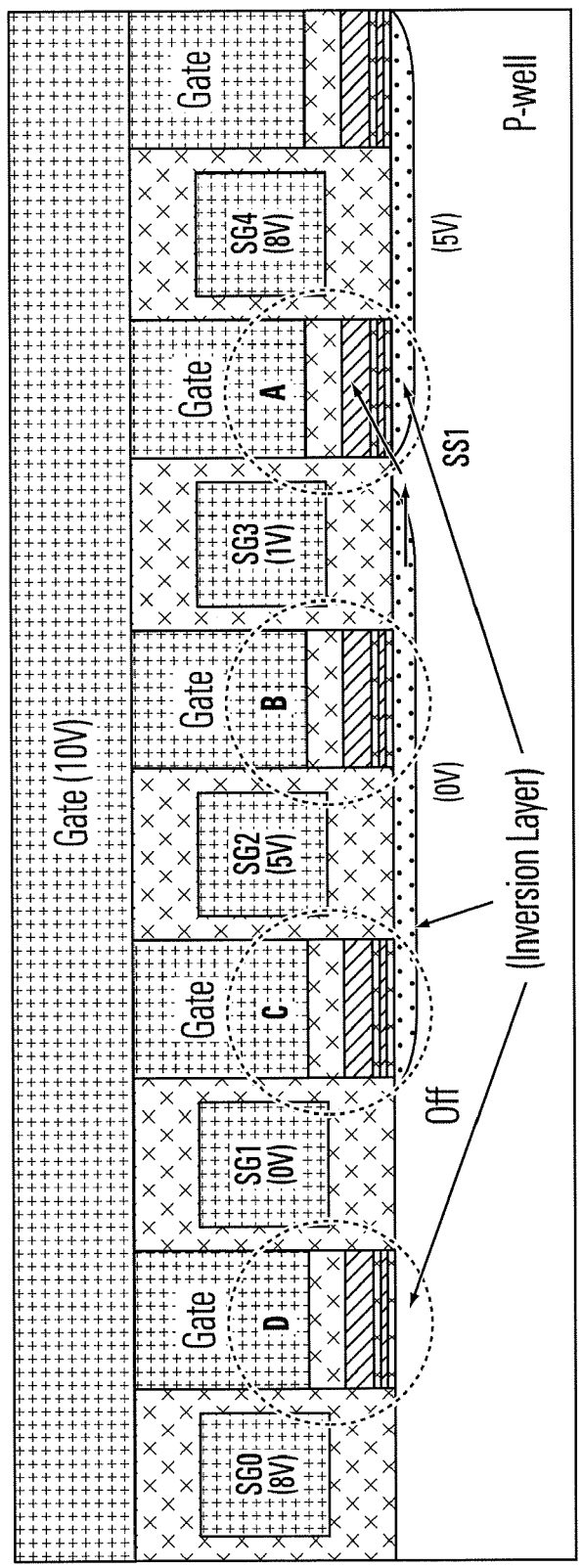
FIG. 11B is a layout diagram illustrating the electrical program for the SONONOS SGIB-AND array architecture in the second embodiment in accordance with the present invention.

As illustrated in FIG. 11A, there is a circuit diagram illustrating an electrical program of the SONONOS SGIB-AND array architecture 1100 in the second embodiment, while FIG. 11B is a layout diagram 1150 illustrating the electrical program for the SONONOS SGIB-AND array architecture in the second embodiment. In one example during electrical program of a cell A 1110, the wordline WL1 811 is set to 10 volts while the other wordlines WL0 810, WL2 812, and WLm 813 are set 0 volt. The bitlines BL0 820, BL1 821, and BL3 823 are left floating. The bitline BL2 is set to 0 volt, and the bitline BL4 is set to 5 volts. The sub-gates SG0 830 and SG4 834 are set to 8 volts. The sub-gate SG1 is set to 0 volt, the sub-gate SG2 is set to 5 volts, and the sub-gate SG3 is set to 1 volt.

The bitlines BL0 820, BL1 821, BL2 822, BL3 823, and BL4 824 provide a greater flexibility in programming than sub-gates SG0 830, SG1 831, SG2 832, SG3 833 and SG4 834 because each bitline can be independently programmed. One type of electrical programming method is a source side injection. The source side injection programs a cell to a high voltage threshold Vt state. For example, the source injection applies Vg=10V to the selected WL1, Vg=0V to other WL's, SG=1V for programming and SG=0V for inhibition. The voltage setting of the SG voltage at 1 volt is intended as an illustration such that in general it is 0.5 to 2 volts higher than the threshold voltage under SG gate.

To carry out an electrical program, the selected wordline is applied a high voltage, 10 volts, and the sub-gate SG3 833 is applied 1 volt to perform a source side injection to program a target cell. The SG1 831 is set to 0 volt for program inhibit and the SG4 834 is set to 8 volts to provide sufficient overdrive to reduce a bitline resistance. One of skill in the art should recognize that parallel programming methods such as page programming with 2 kB cells in parallel can burst the programming throughput to more than 10 MB per second while the cell current consumption can be controlled within 2 mA. To avoid program disturbance to other bitlines, the sub-gate SG2 231 is set to 0 volt and turns off the inhibit cell.

The electrical programming is to conduct a source side injection to program a cell to a high voltage threshold, Vt, state. For example in the electrical programming of the cell A 1110, the operations apply Vg=10V to the selected WL$_1$ 811, apply Vg=0V to other wordlines including WL0 810, WL2 812 and WLm 813, set SG3=1V for programming, set SG1=0V for program inhibition, and set SG2=5V for pass gate. The sub-gate SG4 834 is set to 8 volt to highly turn on the sub-gate SG4 834 so that the inversion layer potential can be raised up to 5 volts. In programming the cell A 1110, the sub-gate SG3 833 is set to 1 volt so that the source side injection occurs. The threshold voltage Vt is raised to above the programming voltage, PV. A program inhibition is provided to a cell-B 1012, a cell-C 1014 and a cell-D 1016.

Figure 12A:
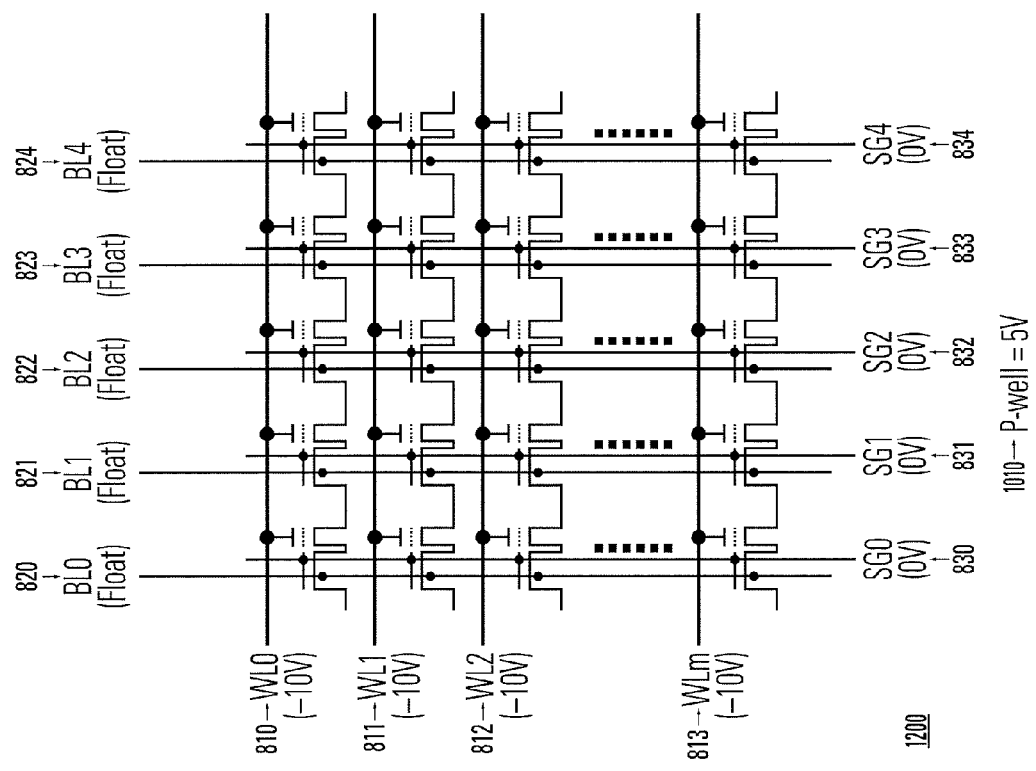
FIG. 12A is a circuit diagram illustrating an electrical erase of the BE-SONOS SGIB-AND array architecture of the second embodiment in accordance with the present invention.
Figure 12B:
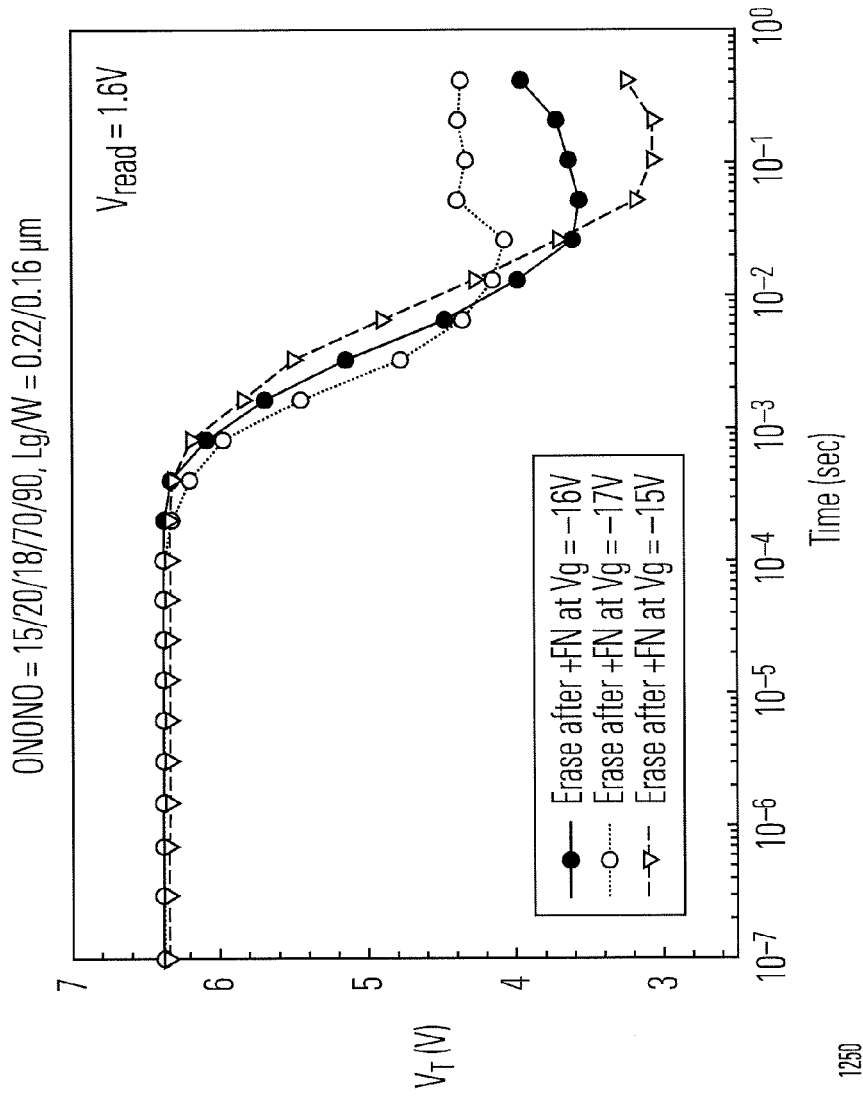
FIG. 12B is a graph diagram illustrating a waveform of a self-converging erase of the second embodiment in accordance with the present invention.

FIG. 12A is a circuit diagram 1200 illustrating an electrical erase of the BE-SONONS SGIB-AND array architecture in the second embodiment, while FIG. 12B is a graph diagram 1250 illustrating a desirable self-converging erase property with respect to the second embodiment. The erase operation is similar to the reset operation. During electrical erase, the wordlines WL0 810, WL1 811, WL2 812, and WLm 813 are set to −10 volts, the bitlines BL0 820, BL1 821, BL2 822, BL3 823, BL4 824 and BL5 825 are left floating, and the sub-gates SG2 830, SG1 831, SG2 832, SG3 833, SG4 834 are set to 0 volt. The electrical erase is performed in the unit of a sector or block. The BE-SONOS device produces a desirable self-converging erase property, as shown in a graph diagram 1250 in FIG. 6B. The erase saturation Vt is dependent on Vg. A higher Vg causes a higher saturated Vt. The convergent time is typically around 10 to 100 msec.

Figure 13A:
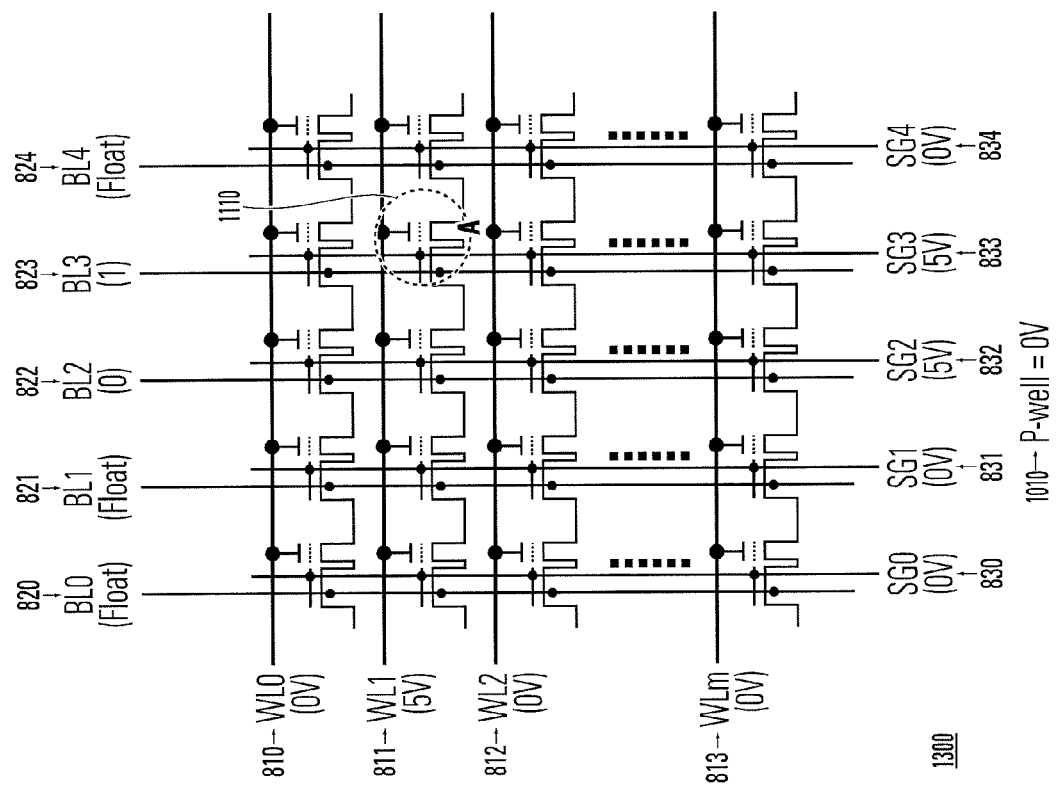
FIG. 13A is a circuit diagram illustrating a read operation of the SONONOS SGIB-AND array architecture in the second embodiment in accordance with the present invention.
Figure 13B:
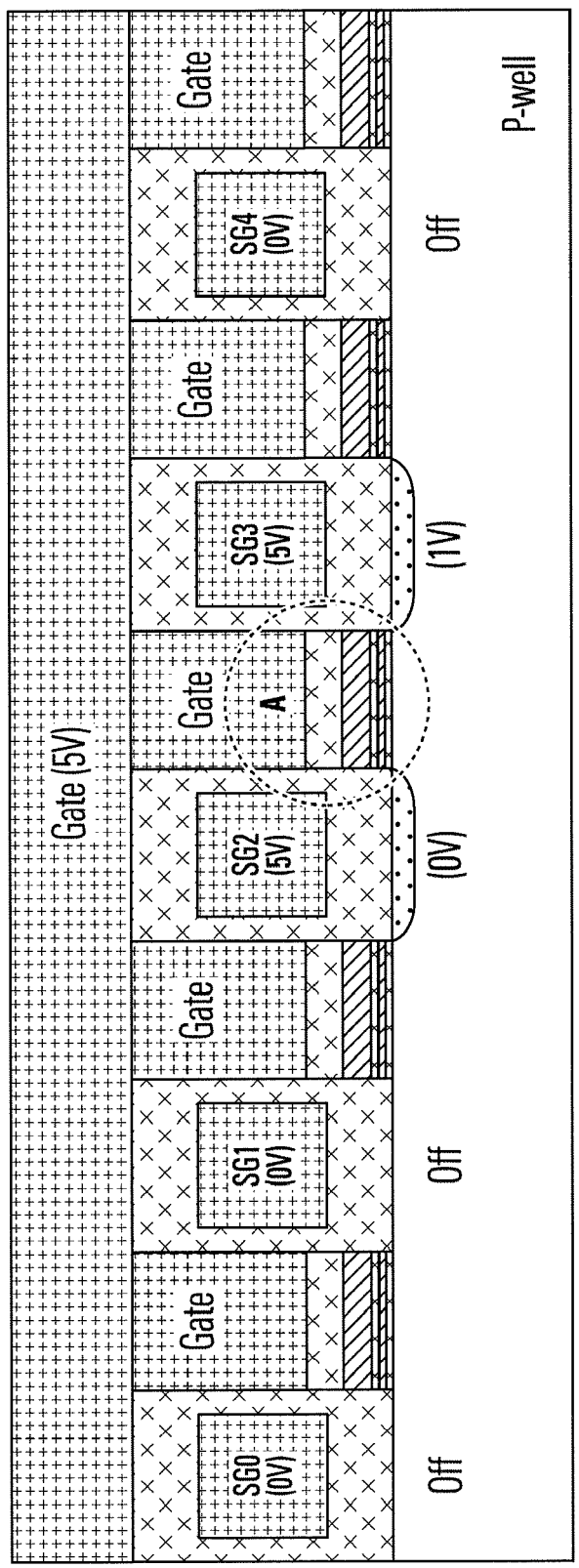
FIG. 13B is a layout diagram illustrating the read operation of the SONONOS SGIB-AND array architecture of the second embodiment in accordance with the present invention.

FIG. 13A is a circuit diagram 1300 illustrating a read operation of the SONONOS SGIB-AND array architecture in the second embodiment, while FIG. 13B is a layout diagram 1350 illustrating the read operation of the SONONOS SGIB-AND array architecture in the second embodiment. In one example during a read operation of the cell A 1110, the wordline WL1 811 is set to 5 volts while the other wordlines WL0 810, WL2 812, and WLm 813 are set 0 volt. The bitlines BL0 820, BL1 821, and FL4 824 are left floating. The bitline BL2 822 is set to 0 volt and the bitline BL3 823 is set to 1 volt. The sub-gates SG0 830, SG1 831, and SG4 834 are set to 0 volts, while SG2 832 and SG3 833 are set to 5 volts. A read operation is performed by applying a gate voltage that is between an erased state Vt (EV) and a programmed state Vt (PV). The gate voltage is typically around 5 volts. Alternatively, the gate voltage can be selected to be more than 5 volts or less than 5 volts, provided the gate voltage falls in the range of a high Vt value and a low Vt value. If Vt of the cell-A 422 is higher than 5 volts, then the read current is likely to be a very small value (e.g., <0.1 µA). If Vt of the cell-A 422 is less than 5 volts, the read current is likely to be a high value (e.g., >0.1 µA). The state of a memory can then be identified.

The applied voltage at a bitline (BL) is typically around 1 volt. A larger read voltage will induce more current, but the read disturbance may be larger. The WL number of SG-AND string is typically 64, 128, or 256. A larger number of SG-AND string may save more overhead and increase the array efficiency. However, the program distribution may be larger. A trade-off is weighed in choosing an adequate number of SGIB-AND string.

Although the above read function describes a random access read operation, one of ordinary skill in the art should recognize that a page read of multiple cells are possible without departing from the spirits of the present invention. The invention has been described with reference to specific exemplary embodiments. Various modifications, adaptations, and changes may be made without departing from the spirit and scope of the invention. Accordingly, the specification and drawings are to be regarded as illustrative of the principles of this invention rather than restrictive, the invention is defined by the following appended claims.

We claim:

1. A method for operating an AND memory array having columns of bandgap engineered SONOS (BE-SONOS) devices, each column of BE-SONOS devices corresponding to a sub-gate line and a wordline, comprising:

resetting a plurality of BE-SONOS devices in the AND memory array, the plurality of BE-SONOS devices producing a self-converging reset to reset a threshold voltage Vt value;

programming electrically a selected BE-SONOS device in a first column of the BE-SONOS devices, the first column of the BE-SONOS devices corresponding to a first wordline to which is applied a high voltage, the first column of the BE-SONOS devices corresponding to a first sub-gate line to which is applied a low voltage to perform source side injection; and erasing electrically the plurality of BE-SONOS devices in the AND memory array, the plurality of BE-SONOS devices producing a self-converging erase to the reset voltage threshold Vt value.

2. The method of claim 1 further comprising reading the selected BE-SONOS device, wherein the voltage of the first wordline is raised to a voltage that is between an erase state level and a program state level.

3. The method of claim 1 wherein the first sub-gate line assists source side injection during programming when the first sub-gate line is a slightly turned-on state.

4. The method of claim 1 wherein the first sub-gate line is biased to create an inversion layer for connection to a first metal bitline when the first subgate line is an ON state.

5. The method of claim 1 wherein the low voltage applied to the first sub-gate line is 1-2 volts.

* * * * *